US012366692B2

(12) United States Patent
Ockenfuss et al.

(10) Patent No.: US 12,366,692 B2
(45) Date of Patent: Jul. 22, 2025

(54) METAL-DIELECTRIC OPTICAL FILTER, SENSOR DEVICE, AND FABRICATION METHOD

(71) Applicant: VIAVI Solutions Inc., Chandler, AZ (US)

(72) Inventors: Georg J. Ockenfuss, Santa Rosa, CA (US); Tim Gustafson, Santa Rosa, CA (US); Jeffrey James Kuna, San Francisco, CA (US); Markus Bilger, Santa Rosa, CA (US); Richard A. Bradley, Jr., Santa Rosa, CA (US)

(73) Assignee: VIAVI Solutions Inc., Chandler, AZ (US)

( * ) Notice: Subject to any disclaimer, the term of this patent is extended or adjusted under 35 U.S.C. 154(b) by 0 days.

(21) Appl. No.: 18/349,404

(22) Filed: Jul. 10, 2023

(65) Prior Publication Data
US 2023/0350116 A1    Nov. 2, 2023

Related U.S. Application Data

(63) Continuation of application No. 17/248,285, filed on Jan. 19, 2021, now Pat. No. 11,782,199, which is a (Continued)

(51) Int. Cl.
*G02B 5/28*    (2006.01)
*G02B 1/10*    (2015.01)
*H10F 39/00*    (2025.01)

(52) U.S. Cl.
CPC .............. *G02B 5/285* (2013.01); *G02B 1/10* (2013.01); *G02B 5/281* (2013.01); *G02B 5/283* (2013.01);
(Continued)

(58) Field of Classification Search
CPC .......... G02B 5/285; G02B 1/10; G02B 5/281; G02B 5/283; H01L 27/14621; H01L 27/14685
See application file for complete search history.

(56) References Cited

U.S. PATENT DOCUMENTS 4,029,394 A    6/1977 Araki
4,979,803 A    12/1990 McGuckin et al.
(Continued)

FOREIGN PATENT DOCUMENTS

CN    1269699 A    10/2000
CN    1582591 A    2/2005
(Continued)

OTHER PUBLICATIONS

Dandin M., et al., "Optical Filtering Technologies for Integrated Fluorescence Sensors," Lab on a Chip, Jan. 1, 2007, vol. 7(8), pp. 955-977.
(Continued)

*Primary Examiner* — Georgia Y Epps
*Assistant Examiner* — Don J Williams
(74) *Attorney, Agent, or Firm* — Harrity & Harrity, LLP

(57) ABSTRACT

An optical filter, a sensor device including the optical filter, and a method of fabricating the optical filter are provided. The optical filter includes one or more dielectric layers and one or more metal layers stacked in alternation. The metal layers are intrinsically protected by the dielectric layers. In particular, the metal layers have tapered edges that are protectively covered by one or more of the dielectric layers.

20 Claims, 20 Drawing Sheets

Related U.S. Application Data continuation of application No. 16/266,913, filed on Feb. 4, 2019, now Pat. No. 10,928,570, which is a continuation of application No. 14/308,343, filed on Jun. 18, 2014, now Pat. No. 10,197,716, which is a continuation-in-part of application No. 13/720,728, filed on Dec. 19, 2012, now Pat. No. 9,448,346.

(52) U.S. Cl.
CPC ....... *H10F 39/024* (2025.01); *H10F 39/8053* (2025.01)

(56) References Cited

U.S. PATENT DOCUMENTS

| | | |
|---|---|---|
| 4,979,807 A | 12/1990 | Matsuoka et al. |
| 5,120,622 A | 6/1992 | Hanrahan et al. |
| 5,337,191 A | 8/1994 | Austin |
| 5,360,698 A | 11/1994 | Hanrahan |
| 5,422,730 A | 6/1995 | Barlow et al. |
| 5,528,082 A | 6/1996 | Ho et al. |
| 5,577,020 A | 11/1996 | Utsunomiya et al. |
| 5,587,090 A | 12/1996 | Belcher et al. |
| 5,648,653 A | 7/1997 | Sakamoto et al. |
| 5,711,889 A | 1/1998 | Buchsbaum et al. |
| 5,784,507 A | 7/1998 | Holm-Kennedy et al. |
| 5,808,293 A | 9/1998 | Yang et al. |
| 6,031,653 A | 2/2000 | Wang et al. |
| 6,034,820 A | 3/2000 | Someno et al. |
| 6,057,925 A | 5/2000 | Anthon et al. |
| 6,238,583 B1 | 5/2001 | Edlinger et al. |
| 6,278,540 B1 | 8/2001 | Wang |
| 6,383,894 B1 | 5/2002 | Wester |
| 6,565,770 B1 | 5/2003 | Mayer et al. |
| 6,579,423 B2 | 6/2003 | Anzaki et al. |
| 6,638,668 B2 | 10/2003 | Buchsbaum et al. |
| 6,783,900 B2 | 8/2004 | Venkataraman et al. |
| 6,809,859 B2 | 10/2004 | Erdogan et al. |
| 7,045,471 B2 | 5/2006 | Kobayashi et al. |
| 7,078,779 B2 | 7/2006 | Wang et al. |
| 7,079,252 B1 | 7/2006 | Debreczeny et al. |
| 7,119,960 B1 | 10/2006 | Erdogan et al. |
| 7,133,197 B2 | 11/2006 | Ockenfuss et al. |
| 7,230,779 B2 | 6/2007 | Kunii et al. |
| 7,239,464 B2 | 7/2007 | Okami et al. |
| 7,648,808 B2 | 1/2010 | Buchsbaum et al. |
| 7,708,945 B1 | 5/2010 | Abel et al. |
| 7,824,777 B2 | 11/2010 | Stoessel et al. |
| 7,875,947 B2 | 1/2011 | Moon et al. |
| 8,274,051 B1 | 9/2012 | Aswell et al. |
| 8,300,313 B2 | 10/2012 | Pradhan et al. |
| 8,384,013 B2 | 2/2013 | Yamada et al. |
| 8,587,080 B2 | 11/2013 | Gidon et al. |
| 8,958,156 B1 | 2/2015 | Erdogan et al. |
| 9,317,162 B2 | 4/2016 | Kuo |
| 9,448,346 B2 | 9/2016 | Ockenfuss et al. |
| 9,568,362 B2 | 2/2017 | Ockenfuss et al. |
| 9,694,618 B2 | 7/2017 | Brehm et al. |
| 10,197,716 B2 | 2/2019 | Ockenfuss et al. |
| 10,222,523 B2 | 3/2019 | Ockenfuss |
| 10,378,955 B2 | 8/2019 | Ockenfuss |
| 10,670,455 B2 | 6/2020 | Ockenfuss |
| 10,928,570 B2 | 2/2021 | Ockenfuss et al. |
| 11,782,199 B2 * | 10/2023 | Ockenfuss ............. G02B 5/285 359/359 |
| 2002/0074513 A1 | 6/2002 | Abel et al. |
| 2002/0119658 A1 | 8/2002 | Honda et al. |
| 2002/0163641 A1 | 11/2002 | Shroder et al. |
| 2002/0196568 A1 | 12/2002 | Edlinger et al. |
| 2003/0038941 A1 | 2/2003 | Potyrailo et al. |
| 2003/0103150 A1 | 6/2003 | Catrysse et al. |
| 2003/0164895 A1 | 9/2003 | Viinikanoja et al. |
| 2004/0135921 A1 | 7/2004 | Murata et al. |
| 2004/0218187 A1 | 11/2004 | Cole et al. |
| 2004/0233524 A1 | 11/2004 | Lippey et al. |
| 2005/0068534 A1 | 3/2005 | Kleinfeld et al. |
| 2005/0106509 A1* | 5/2005 | Chang ................. G11B 5/3903 430/311 |
| 2005/0110999 A1 | 5/2005 | Erdogan et al. |
| 2005/0185267 A1 | 8/2005 | Ockenfuss et al. |
| 2006/0180886 A1 | 8/2006 | Tsang |
| 2007/0097691 A1 | 5/2007 | Wu et al. |
| 2007/0139772 A1 | 6/2007 | Wang et al. |
| 2008/0055717 A1 | 3/2008 | Pradhan et al. |
| 2008/0316628 A1 | 12/2008 | Nakajima et al. |
| 2009/0109537 A1 | 4/2009 | Bright et al. |
| 2009/0194668 A1 | 8/2009 | Kong |
| 2009/0273745 A1 | 11/2009 | Liu et al. |
| 2009/0315131 A1 | 12/2009 | Hung et al. |
| 2010/0067000 A1 | 3/2010 | Baumberg et al. |
| 2010/0072568 A1 | 3/2010 | Park et al. |
| 2010/0105035 A1 | 4/2010 | Hashsham et al. |
| 2010/0149483 A1 | 6/2010 | Chiavetta, III et al. |
| 2010/0201926 A1 | 8/2010 | Lee et al. |
| 2010/0202734 A1 | 8/2010 | Decorby et al. |
| 2011/0058075 A1 | 3/2011 | Yanagita et al. |
| 2011/0204463 A1 | 8/2011 | Grand |
| 2011/0291113 A1 | 12/2011 | Chamberlin |
| 2012/0044491 A1 | 2/2012 | Urushidani et al. |
| 2012/0085944 A1 | 4/2012 | Gidon et al. |
| 2012/0092666 A1 | 4/2012 | Meijer et al. |
| 2012/0156714 A1 | 6/2012 | O'Brien et al. |
| 2012/0187512 A1 | 7/2012 | Wang et al. |
| 2013/0020503 A1 | 1/2013 | Geddes et al. |
| 2013/0043551 A1 | 2/2013 | Yoshizawa |
| 2013/0307107 A1 | 11/2013 | Tsai et al. |
| 2014/0014838 A1 | 1/2014 | Hendrix et al. |
| 2021/0141133 A1 | 5/2021 | Ockenfuss et al. |

FOREIGN PATENT DOCUMENTS

| | | |
|---|---|---|
| CN | 1664695 A | 9/2005 |
| CN | 1669332 A | 9/2005 |
| CN | 1227521 C | 11/2005 |
| CN | 1725045 A | 1/2006 |
| CN | 1794445 A | 6/2006 |
| CN | 1932652 A | 3/2007 |
| CN | 1970837 A | 5/2007 |
| CN | 1992375 A | 7/2007 |
| CN | 101201422 A | 6/2008 |
| CN | 101447461 A | 6/2009 |
| CN | 101449381 A | 6/2009 |
| CN | 101592751 A | 12/2009 |
| CN | 102037381 A | 4/2011 |
| CN | 102574411 A | 7/2012 |
| CN | 102683322 A | 9/2012 |
| CN | 102751447 A | 10/2012 |
| CN | 102956655 A | 3/2013 |
| CN | 103219357 A | 7/2013 |
| DE | 4442045 A1 | 5/1996 |
| EP | 2746738 A2 | 6/2014 |
| EP | 2746739 A2 | 6/2014 |
| JP | S59152407 A | 8/1984 |
| JP | H07170366 A | 7/1995 |
| JP | H08107107 A | 4/1996 |
| JP | H11307242 A | 11/1999 |
| JP | H11328715 A | 11/1999 |
| JP | 2000156485 A | 6/2000 |
| JP | 2001255666 A | 9/2001 |
| JP | 2002023063 A | 1/2002 |
| JP | 2002504699 A | 2/2002 |
| JP | 2002305295 A | 10/2002 |
| JP | 2006040976 A | 2/2006 |
| JP | 2006065306 A | 3/2006 |
| JP | 2006190958 A | 7/2006 |
| JP | 2006227432 A | 8/2006 |
| JP | 2007219515 A | 8/2007 |
| JP | 2007305276 A | 11/2007 |
| JP | 2008008975 A | 1/2008 |
| JP | 2008034198 A | 2/2008 |
| JP | 2008276112 A | 11/2008 |
| JP | 2009102717 A | 5/2009 |
| JP | 2009288293 A | 12/2009 |
| JP | 2009545150 A | 12/2009 |

(56) References Cited

FOREIGN PATENT DOCUMENTS

| JP | 2010049137 A | 3/2010 |
|---|---|---|
| JP | 2010067728 A | 3/2010 |
| JP | 2010128259 A | 6/2010 |
| JP | 2011123111 A | 6/2011 |
| JP | 2011243862 A | 12/2011 |
| JP | 2012042584 A | 3/2012 |
| JP | 2012169489 A | 9/2012 |
| JP | 2012209913 A | 10/2012 |
| JP | 2013015827 A | 1/2013 |
| JP | 2013041027 A | 2/2013 |
| JP | 2013095315 A | 5/2013 |
| JP | 2013229528 A | 11/2013 |
| TW | 548843 B | 8/2003 |
| TW | I307814 B | 3/2009 |
| TW | M427564 U | 4/2012 |
| TW | 201250548 A | 12/2012 |
| TW | I388054 B | 3/2013 |
| TW | 201432248 A | 8/2014 |
| TW | I497045 B | 8/2015 |
| WO | 2007037553 A1 | 4/2007 |

OTHER PUBLICATIONS

Dobowolski J.A., et al., "Metal/Dielectric Transmission Interference Filters With Low Reflectance. 1. Design," Applied Optics, Sep. 1, 1995, vol. 34(25), pp. 5673-5683.
Ebbesen T.W., et al., "Extraordinary Optical Transmission Through Sub-Wavelength Hole Arrays," Letters to Nature, Feb. 12, 1998, vol. 391, pp. 667-669.
European Search Report for Application No. EP13196813.3, mailed on Mar. 28, 2014, 8 pages.
Extended European Search report for Application No. EP13196812.5, mailed on Jul. 25, 2014, 13 pages.
Extended European Search Report for Application No. EP14895400, mailed on Apr. 18, 2018, 10 pages.
Holm-Kennedy J.W., et al., "A Novel Monolithic, Chip-integrated, Color Spectrometer: The Distributed Wavelength Filter Component," Current Developments in Optical Design and Optical Engineering, 1991, vol. 1527, pp. 322-331.
International Search Report for Application No. PCT/US2014/043041, mailed on Jan. 2, 2015, 4 pages.
Mu J., et al., "Design and Fabrication of a High Transmissivity Metal-Dielectric Ultraviolet Band-Pass Filter," Applied Physics Letters, 2013, vol. 102(21), p. 213105.
Partial European Search Report for Application No. EP13196812.5, mailed on Mar. 17, 2014, 4 pages.
Partial European Search Report for Application No. EP14895400, mailed on Jan. 17, 2018, 12 pages.
Tao J., et al., "A Wavelength Demultiplexing Structure Based on Metal-Dielectric-Metal Plasmonic Nano-Capillary Resonators," Optics Express , May 24, 2010, vol. 18(11), pp. 11111-11116.
Webster J.R., et al., "Monolithic Capillary Electrophoresis Device With Integrated Fluorescence Detector," Analytical chemistry, American Chemical Society, Apr. 1, 2001, vol. 73(7), pp. 1622-1626.
Weidemaier K., et al., "Multi-Day Pre-Clinical Demonstration of Glucose/Galactose Binding Protein-Based Fiber Optic Sensor," Biosensors and Bioelectronics, 2011, vol. 26(10), pp. 4117-4123.
Whitehurst T.K., et al., "Fluorescence-based Implantable Glucose Sensor with Smartphone Interface," presented at the 48th European Association for the Study of Diabetes (EASD) Annual Meeting in Berlin, Germany, 2012, 1 page.
Written Opinion for Application No. PCT/US2014/043041, mailed on Jan. 2, 2015, 8 pages.
Sullivan B.T., et al., "Metal/Dielectric Transmission Interference Filters With Low Reflectance. 2. Experimental Results ," Applied Optics, Sep. 1, 1995, vol. 34(25), pp. 5684-5694.

\* cited by examiner

| Exemplary Red Filter | | | |
|---|---|---|---|
| Layer No. | Material | Thickness (nm) | Type |
| 1 | H | 430.3 | QWOT |
| 2 | ZnO | 2 | Physical |
| 3 | Ag | 23.82 | Physical |
| 4 | ZnO | 2 | Physical |
| 5 | H | 807.9 | QWOT |
| 6 | ZnO | 2 | Physical |
| 7 | Ag | 31.16 | Physical |
| 8 | ZnO | 2 | Physical |
| 9 | H | 2087.6 | QWOT |
| 10 | ZnO | 2 | Physical |
| 11 | Ag | 31.92 | Physical |
| 12 | ZnO | 2 | Physical |
| 13 | H | 826.4 | QWOT |
| 14 | ZnO | 2 | Physical |
| 15 | Ag | 28.54 | Physical |
| 16 | ZnO | 2 | Physical |
| 17 | H | 455.2 | QWOT |

FIG. 4A

| Exemplary Green Filter ||||
|---|---|---|---|
| Layer No. | Material | Thickness (nm) | Type |
| 1 | H | 535.9 | QWOT |
| 2 | ZnO | 2 | Physical |
| 3 | Ag | 23.82 | Physical |
| 4 | ZnO | 2 | Physical |
| 5 | H | 634.0 | QWOT |
| 6 | ZnO | 2 | Physical |
| 7 | Ag | 31.16 | Physical |
| 8 | ZnO | 2 | Physical |
| 9 | H | 1688.3 | QWOT |
| 10 | ZnO | 2 | Physical |
| 11 | Ag | 31.92 | Physical |
| 12 | ZnO | 2 | Physical |
| 13 | H | 667.0 | QWOT |
| 14 | ZnO | 2 | Physical |
| 15 | Ag | 28.54 | Physical |
| 16 | ZnO | 2 | Physical |
| 17 | H | 541.8 | QWOT |

FIG. 4B

| Exemplary Blue Filter ||||
| --- | --- | --- | --- |
| Layer No. | Material | Thickness (nm) | Type |
| 1 | H | 248.1 | QWOT |
| 2 | ZnO | 2 | Physical |
| 3 | Ag | 31.01 | Physical |
| 4 | ZnO | 2 | Physical |
| 5 | H | 431.8 | QWOT |
| 6 | ZnO | 2 | Physical |
| 7 | Ag | 33.26 | Physical |
| 8 | ZnO | 2 | Physical |
| 9 | H | 1070.0 | QWOT |

FIG. 4C

| Exemplary Photopic Filter | | | |
|---|---|---|---|
| Layer No. | Material | Thickness (nm) | Type |
| 1 | H | 1444.4 | QWOT |
| 2 | ZnO | 2 | Physical |
| 3 | Ag | 13.47 | Physical |
| 4 | ZnO | 2 | Physical |
| 5 | H | 1782.7 | QWOT |
| 6 | ZnO | 2 | Physical |
| 7 | Ag | 26.41 | Physical |
| 8 | ZnO | 2 | Physical |
| 9 | H | 685.0 | QWOT |
| 10 | ZnO | 2 | Physical |
| 11 | Ag | 27.85 | Physical |
| 12 | ZnO | 2 | Physical |
| 13 | H | 382.9 | QWOT |

FIG. 4D

| Exemplary UV Filters | | | | | | |
|---|---|---|---|---|---|---|
| | UVA | | UVB | | 220 nm | |
| Material | Number of layers | Thickness (nm) | Number of layers | Thickness (nm) | Number of layers | Thickness (nm) |
| Al | 4 | 54 | 4 | 73 | 4 | 64 |
| $Ta_2O_5$ | 5 | 296 | | | | |
| $HfO_2$ | | | 5 | 325 | 5 | 213 |
| Total | 9 | 350 | 9 | 398 | 9 | 277 |

FIG. 12

METAL-DIELECTRIC OPTICAL FILTER, SENSOR DEVICE, AND FABRICATION METHOD

CROSS-REFERENCE TO RELATED APPLICATIONS

This application is a continuation of U.S. patent application Ser. No. 17/248,285, filed Jan. 19, 2021, which is a continuation of U.S. patent application Ser. No. 16/266,913 filed Feb. 4, 2019 (now U.S. Pat. No. 10,928,570), which is a continuation of U.S. patent application Ser. No. 14/308,343, filed Jun. 18, 2014 (now U.S. Pat. No. 10,197,716), which is a continuation-in-part of U.S. patent application Ser. No. 13/720,728, filed Dec. 19, 2012 (now U.S. Pat. No. 9,448,346), which are incorporated herein by reference.

TECHNICAL FIELD OF THE INVENTION

The present invention relates to a metal-dielectric optical filter, a sensor device including such an optical filter, and a method of fabricating such an optical filter.

BACKGROUND OF THE INVENTION

Optical sensors are used in optical sensor devices, such as image sensors, ambient light sensors, proximity sensors, hue sensors, and UV sensors, to convert optical signals into electrical signals, allowing detection of optical signals or image capture. An optical sensor, generally, includes one or more sensor elements and one or more optical filters disposed over the one or more sensor elements.

For example, a color image sensor includes a plurality of color filters disposed in an array, i.e., a color filter array (CFA). The CFA includes different types of color filters having different color passbands, e.g., red, green, and blue (RGB) filters.

Conventionally, absorption filters formed using dyes are used as color filters. Unfortunately, such dye-based color filters have relatively broad color passbands, resulting in less brilliant colors. Alternatively, dichroic filters, i.e., interference filters, formed of stacked dielectric layers may be used as color filters. Such all-dielectric color filters have higher transmission levels and narrower color passbands, resulting in brighter and more brilliant colors. However, the color passbands of all-dielectric color filters undergo relatively large center-wavelength shifts with changes in incidence angle, resulting in undesirable shifts in color.

Furthermore, all-dielectric color filters, typically, include a large number of stacked dielectric layers and are relatively thick. Consequently, all-dielectric color filters are expensive and difficult to manufacture. In particular, all-dielectric color filters are difficult to etch chemically. Lift-off processes are, therefore, preferred for patterning. Examples of lift-off processes for patterning all-dielectric color filters in CFAs are disclosed in U.S. Pat. No. 5,120,622 to Hanrahan, issued on Jun. 9, 1992, in U.S. Pat. No. 5,711,889 to Buchsbaum, issued on Jan. 27, 1998, in U.S. Pat. No. 6,238,583 to Edlinger, et al., issued on May 29, 2001, in U.S. Pat. No. 6,638,668 to Buchsbaum, et al., issued on Oct. 28, 2003, and in U.S. Pat. No. 7,648,808 to Buchsbaum, et al., issued on Jan. 19, 2010, which are incorporated herein by reference. However, lift-off processes are, generally, limited to a filter spacing of about twice the filter height, which makes it difficult to achieve all-dielectric CFAs suitable for smaller color image sensors.

In addition to transmitting visible light in color passbands, both dye-based and all-dielectric color filters also transmit infrared (IR) light, which contributes to noise. Therefore, a color image sensor, typically, also includes an IR-blocking filter disposed over the CFA. IR-blocking filters are also used in other optical sensor devices operating in the visible spectral range. Conventionally, absorption filters formed of colored glass or dichroic filters formed of stacked dielectric layers are used as IR-blocking filters. Alternatively, induced transmission filters formed of stacked metal and dielectric layers may be used as IR-blocking filters. Examples of metal-dielectric IR-blocking filters are disclosed in U.S. Pat. No. 5,648,653 to Sakamoto, et al., issued on Jul. 15, 1997, and in U.S. Pat. No. 7,133,197 to Ockenfuss, et al., issued on Nov. 7, 2006, which are incorporated herein by reference.

To avoid the use of an IR-blocking filter, induced transmission filters formed of stacked metal and dielectric layers may be used as color filters. Metal-dielectric optical filters, such as metal-dielectric color filters, are inherently IR-blocking. Typically, metal-dielectric color filters have relatively narrow color passbands that do not shift significantly in wavelength with changes in incidence angle. Furthermore, metal-dielectric color filters are, generally, much thinner than all-dielectric color filters. Examples of metal-dielectric color filters are disclosed in U.S. Pat. No. 4,979,803 to McGuckin, et al., issued on Dec. 25, 1990, in U.S. Pat. No. 6,031,653 to Wang, issued on Feb. 29, 2000, in U.S. Patent Application No. 2009/0302407 to Gidon, et al., published on Dec. 10, 2009, in U.S. Patent Application No. 2011/0204463 to Grand, published on Aug. 25, 2011, and in U.S. Patent Application No. 2012/0085944 to Gidon, et al., published on Apr. 12, 2012, which are incorporated herein by reference.

Typically, the metal layers in metal-dielectric optical filters, such as metal-dielectric color filters, are silver or aluminum layers, which are environmentally unstable and which deteriorate when exposed to even small amounts of water or sulfur. Chemically etching the silver layers exposes the edges of the silver layers to the environment, allowing deterioration. Therefore, in most instances, metal-dielectric color filters in CFAs are patterned by adjusting the thicknesses of only the dielectric layers to select different color passbands for the metal-dielectric color filters. In other words, different types of metal-dielectric color filters having different color passbands are required to have the same number of silver layers as one another and the same thicknesses of the silver layers as one another. Unfortunately, these requirements severely limit the possible optical designs for the metal-dielectric color filters.

The present invention provides metal-dielectric optical filters that are not subject to these requirements, which are particularly suitable for use in image sensors and other sensor devices, such as ambient light sensors, proximity sensors, hue sensors, and UV sensors.

SUMMARY OF THE INVENTION

Accordingly, the present invention relates to an optical filter, disposed on a substrate, comprising: one or more dielectric layers; and one or more metal layers, stacked in alternation with the one or more dielectric layers on the substrate, wherein each of the one or more metal layers has a tapered edge, at a periphery of the optical filter, that is protectively covered by at least one of the one or more dielectric layers.

The present invention also relates to a sensor device comprising: one or more sensor elements; and one or more optical filters disposed over the one or more sensor elements, wherein each of the one or more optical filters includes: one or more dielectric layers; and one or more metal layers stacked in alternation with the one or more dielectric layers, wherein each of the one or more metal layers has a tapered edge, at a periphery of the optical filter, that is protectively covered by at least one or more dielectric layers.

The present invention further relates to a method of fabricating an optical filter, the method comprising: providing a substrate; applying a photoresist layer onto the substrate; patterning the photoresist layer to uncover a filter region of the substrate, whereby an overhang is formed in the patterned photoresist layer surrounding the filter region; depositing a multilayer stack, including one or more metal layers stacked in alternation with one or more dielectric layers, onto the patterned photoresist layer and the filter region of the substrate; removing the patterned photoresist layer and a portion of the multilayer stack on the patterned photoresist layer so that a portion of the multilayer stack remaining on the filter region of the substrate forms the optical filter, wherein each of the one or more metal layers in the optical filter has a tapered edge, at a periphery of the optical filter, that is protectively covered by at least one of the one or more dielectric layers in the optical filter.

BRIEF DESCRIPTION OF THE DRAWINGS

The present invention will be described in greater detail with reference to the accompanying drawings wherein:

FIG. 4A is a table of layer numbers, materials, and thicknesses for an exemplary red filter;

FIG. 4B is a table of layer numbers, materials, and thicknesses for an exemplary green filter;

FIG. 4C is a table of layer numbers, materials, and thicknesses for an exemplary blue filter;

FIG. 4D is a table of layer numbers, materials, and thicknesses for an exemplary photopic filter;

FIG. 12 is a table of layer numbers, materials, and thicknesses for exemplary ultraviolet-A (UVA), ultraviolet-B (UVB), and 220-nm-centered filters;

DETAILED DESCRIPTION OF THE INVENTION

The present invention provides a metal-dielectric optical filter having protected metal layers, which is particularly suitable for use in a sensor device, such as an image sensor, an ambient light sensor, a proximity sensor, a hue sensor, or an ultraviolet (UV) sensor. The optical filter includes one or more dielectric layers and one or more metal layers stacked in alternation. The metal layers are intrinsically protected by the dielectric layers. In particular, the metal layers have tapered edges that are protectively covered by one or more of the dielectric layers. Accordingly, the metal layers have increased resistance to environmental degradation, resulting in a more environmentally durable optical filter.

Figure 1A:
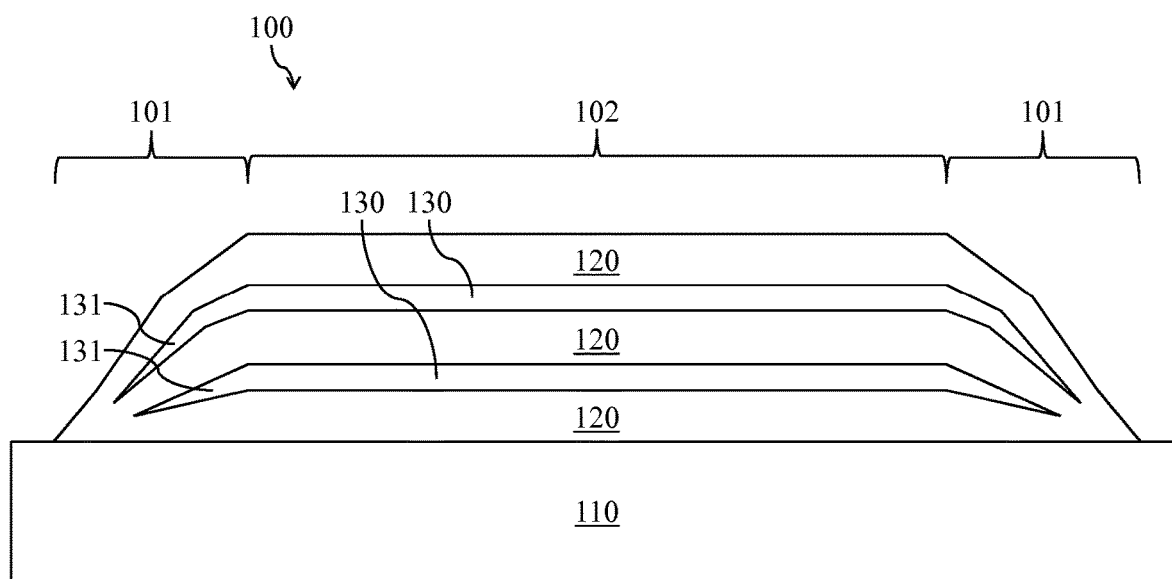
FIG. 1A is a schematic illustration of a cross-section of a first embodiment of an optical filter.

In some embodiments, the one or more dielectric layers and the one or more metal layers are stacked without any intervening layers. With reference to FIG. 1A, a first embodiment of the optical filter 100, disposed on a substrate 110, includes three dielectric layers 120 and two metal layers 130 stacked in alternation. The metal layers 130 are each disposed between and adjacent to two dielectric layers 120 and are, thereby, protected from the environment. The dielectric layers 120 and the metal layers 130 are continuous layers that do not have any microstructures formed therein.

The metal layers 130 have tapered edges 131 at a periphery 101 of the optical filter 100. In other words, the metal layers 130 are substantially uniform in thickness throughout a central portion 102 of the optical filter 100, but taper off in thickness at the periphery 101 of the optical filter 100. The tapered edges 131 extend along the entire peripheries of the metal layers 130 at the periphery 101 of the optical filter 100. Likewise, the dielectric layers 120 are substantially uniform in thickness throughout the central portion 102 of the optical filter 100, but taper off in thickness at the periphery 101 of the optical filter 100. Accordingly, the central portion 102 of the optical filter 100 is substantially uniform in height, whereas the periphery 101 of the optical filter 100 is sloped. In other words, the optical filter 100 has a substantially flat top and sloped sides. Typically, the sides of the optical filter 100 are sloped at an angle of less than about 45° from horizontal. Preferably, the sides of the optical filter 100 are sloped at an angle of less than about 20° from horizontal, more preferably, at an angle of less than about 10° from horizontal.

Advantageously, the tapered edges 131 of the metal layers 130 are not exposed to the environment. Rather, the tapered edges 131 of the metal layers 130 are protectively covered by one or more of the dielectric layers 120 along the entire peripheries of the metal layers 130. The one or more dielectric layers 120 suppress environmental degradation, e.g., corrosion, of the metal layers 130, e.g., by inhibiting the diffusion of sulfur and water into the metal layers 130. Preferably, the metal layers 130 are substantially encapsulated by the dielectric layers 120. More preferably, the tapered edges 131 of the metal layers 130 are protectively covered by adjacent dielectric layers 120, and the metal layers 130 are substantially encapsulated by adjacent dielectric layers 120. In some instances, a top dielectric layer 120, i.e., a dielectric layer 120 at the top of the optical filter 100, protectively covers the tapered edges 131 of all of the metal layers 130 below.

Figure 1B:
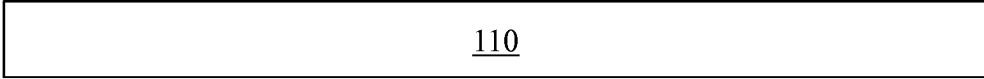
FIGS. 1B to 1G are schematic illustrations of steps in a method of fabricating the optical filter of FIG. 1A.
Figure 1C:
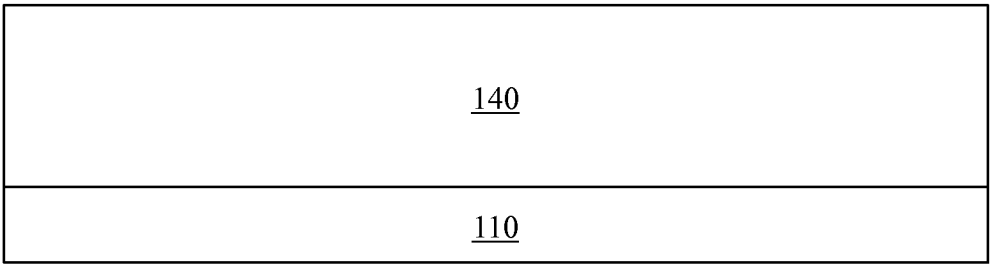

With reference to FIGS. 1B to 1G, the first embodiment of the optical filter 100 may be fabricated by a lift-off process. With particular reference to FIG. 1B, in a first step, the substrate 110 is provided. With particular reference to FIG. 1C, in a second step, a photoresist layer 140 is applied onto the substrate 110. Typically, the photoresist layer 140 is applied by spin coating or spray coating.

Figure 1D:
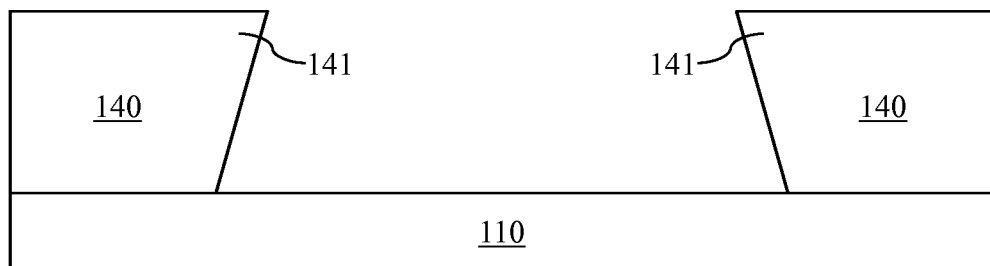

With particular reference to FIG. 1D, in a third step, the photoresist layer 140 is patterned to uncover a region of the substrate 110 where the optical filter 100 is to be disposed, i.e., a filter region. Other regions of the substrate 110 remain covered by the patterned photoresist layer 140. Typically, the photoresist layer 140 is patterned by first exposing a region of the photoresist layer 140 covering the filter region of the substrate 110 to UV light through a mask, and then developing, i.e., etching, the exposed region of the photoresist layer 140 by using a suitable developer or solvent.

The photoresist layer 140 is patterned in such a manner that an overhang 141, i.e., an undercut, is formed in the patterned photoresist layer 140 surrounding the filter region. Typically, the overhang 141 is formed by chemically modifying, e.g., by using a suitable solvent, a top portion of the photoresist layer 140, so that the top portion develops more slowly than a bottom portion of the photoresist layer 140. Alternatively, the overhang 141 may be formed by applying a dual-layer photoresist layer 140, consisting of a top layer that develops more slowly and a bottom layer that develops more quickly, to the substrate 110.

Figure 1E:
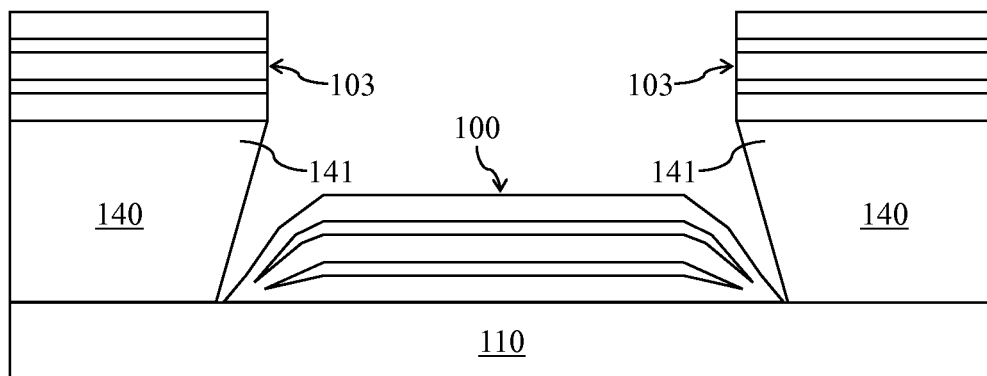

The overhang 141 should be large enough to ensure that the coating, i.e., the multilayer stack 103, subsequently deposited on the patterned photoresist layer 140 and the substrate 110 is not continuous from the substrate 110 to the patterned photoresist layer 140, as shown in FIG. 1E. The overhang 141 is, typically, greater than 2 μm, preferably, greater than 4 μm. In general, the coating should not cover the sides of the patterned photoresist layer 140.

Figure 9A:
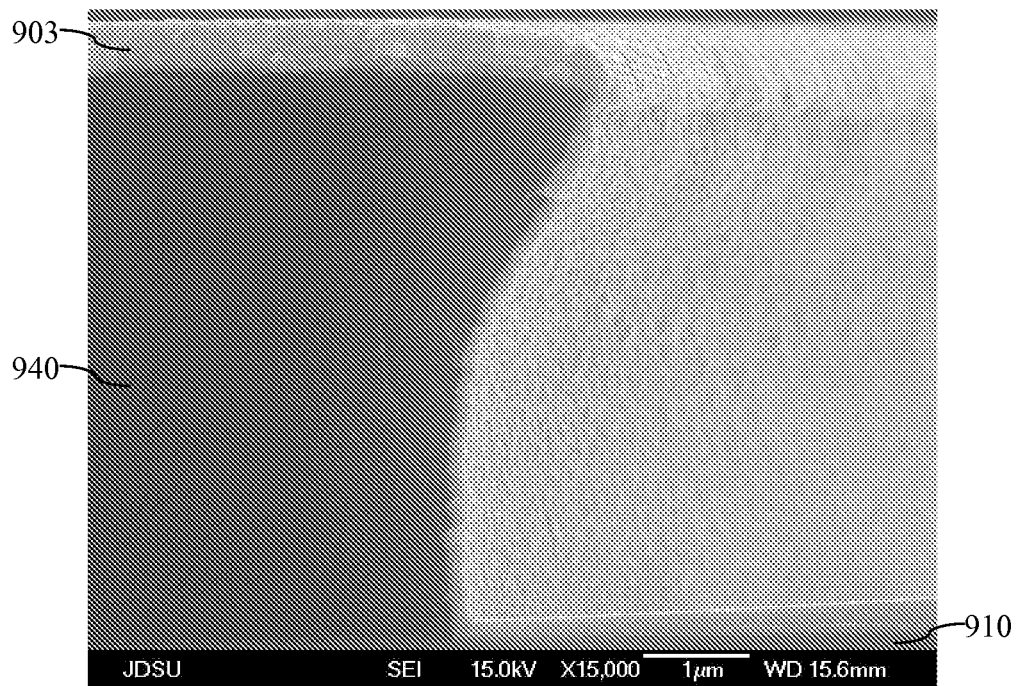
FIGS. 9A and 9B are scanning electron micrographs of a cross-section of a continuous coating deposited on a patterned photoresist layer and a substrate.
Figure 9B:
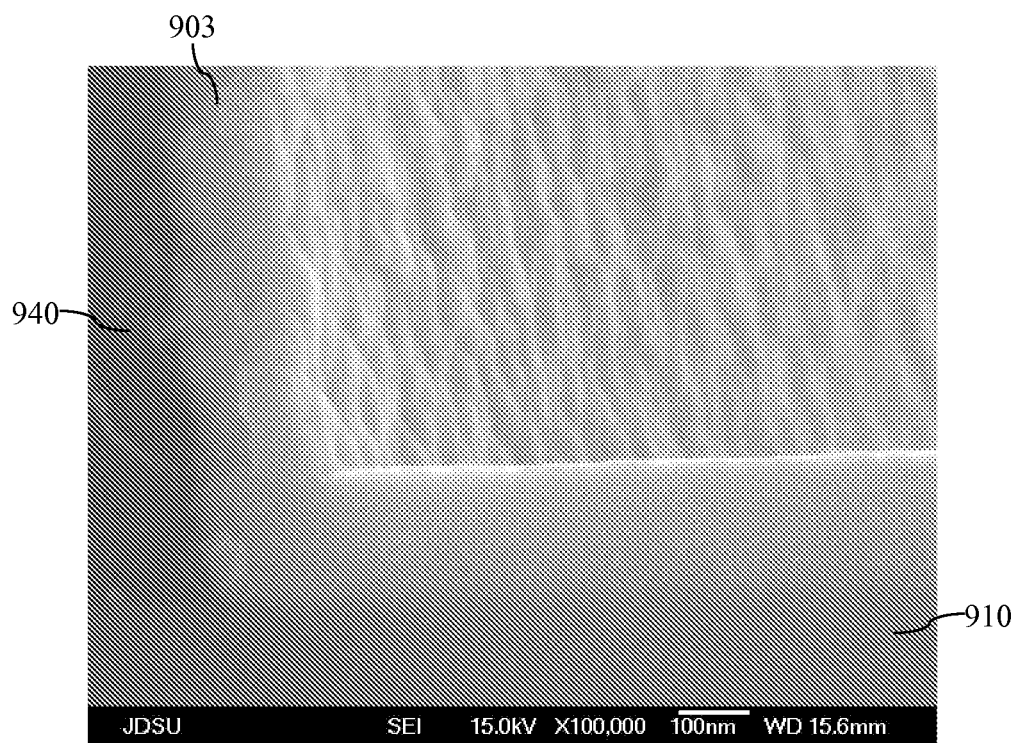
Figure 9C:
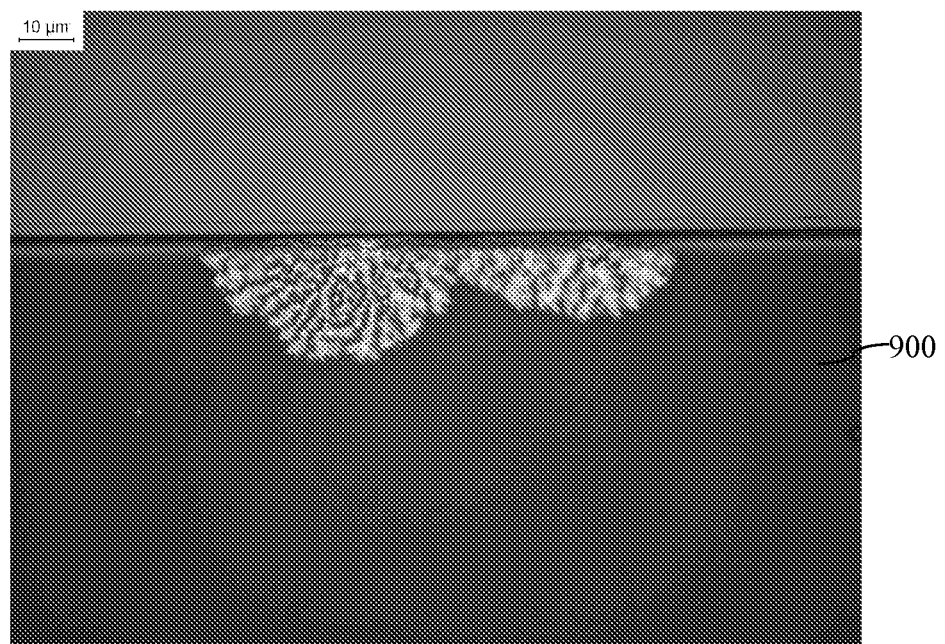
FIG. 9C is an optical micrograph of a top view of an optical filter formed from the continuous coating of FIGS. 9A and 9B, showing corrosion after exposure to high humidity and temperature.

With reference to FIGS. 9A and 9B, when the coating 903 is continuous over the substrate 910 and the patterned photoresist layer 940, during subsequent lift-off of the photoresist layer 940 and the portion of the coating 903 thereon, the coating 903 is broken at the bottom edges of the patterned photoresist layer 940, exposing the edges of the optical filter formed from the coating 903, in particular, the edges of the metal layers of the optical filter, to the environment. Unfortunately, the exposed edges are susceptible to environmental attack, e.g., when exposed to high humidity and temperature, leading to corrosion, as shown in FIG. 9C for a silver-containing optical filter 900.

Figure 10:
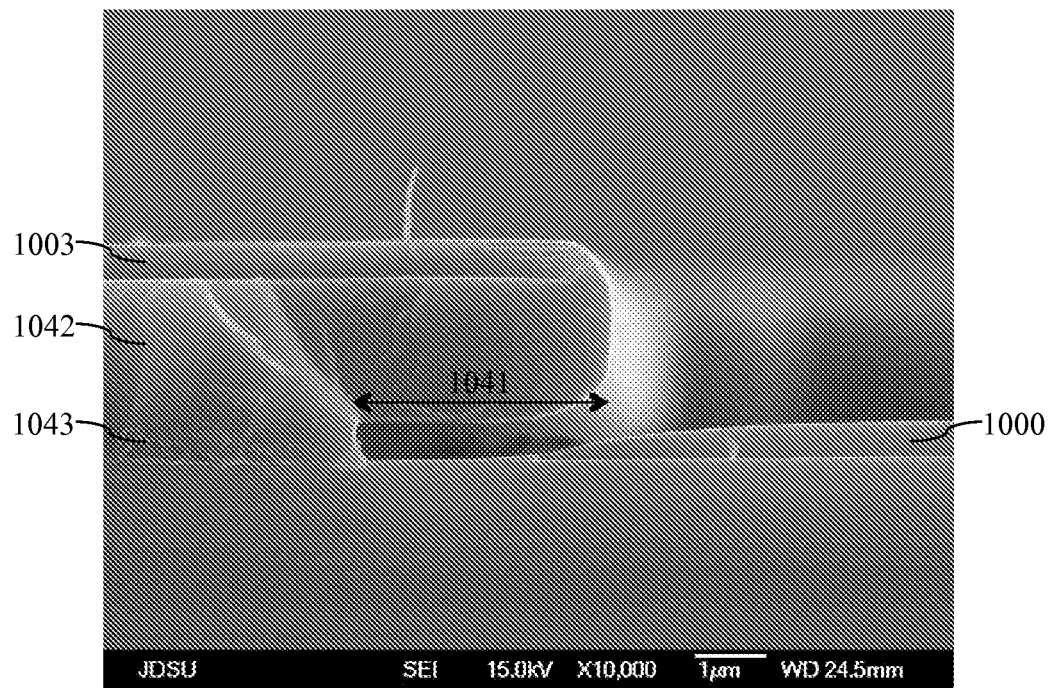
FIG. 10 is a scanning electron micrograph of a cross-section of a non-continuous coating deposited on a patterned photoresist layer and a substrate.

With reference to FIG. 10, in an embodiment that provides a non-continuous coating 1003, the photoresist layer has a bilayer structure, and includes a top layer 1042 and a bottom layer 1043. The top layer 1042 is photosensitive and is patternable by selective exposure to UV light. The bottom layer 1043 is, generally, not photosensitive and acts as a release layer. Suitable examples of resists include AZ Electronic Materials nLOF 2020 for the top photosensitive layer 1042 and Microchem Corp. LOR 10 B for the bottom release layer 1043.

When the photoresist layer is developed, the extent of the overhang 1041 is controlled by the development time. In FIG. 10, the development time was selected to provide an overhang 1041 of about 3 μm. Preferably, the thickness of the bottom release layer 1043 is greater than about 500 nm, and the overhang 1041 is greater than about 2 μm To ensure clean lift-off, i.e., lift-off without breakage of the deposited coating 1003, the thickness of the coating 1003 should, generally, be less than about 70% of the thickness of the bottom release layer 1043. In FIG. 10, the thickness of the bottom release layer 1043 is about 800 nm, the thickness of the top photosensitive layer 1042 is about 2 μm, and the thickness of the coating is about 500 nm. The sides of the optical filter 1000 under the overhang 1041 are sloped at an angle of about 10°.

Figure 11A:
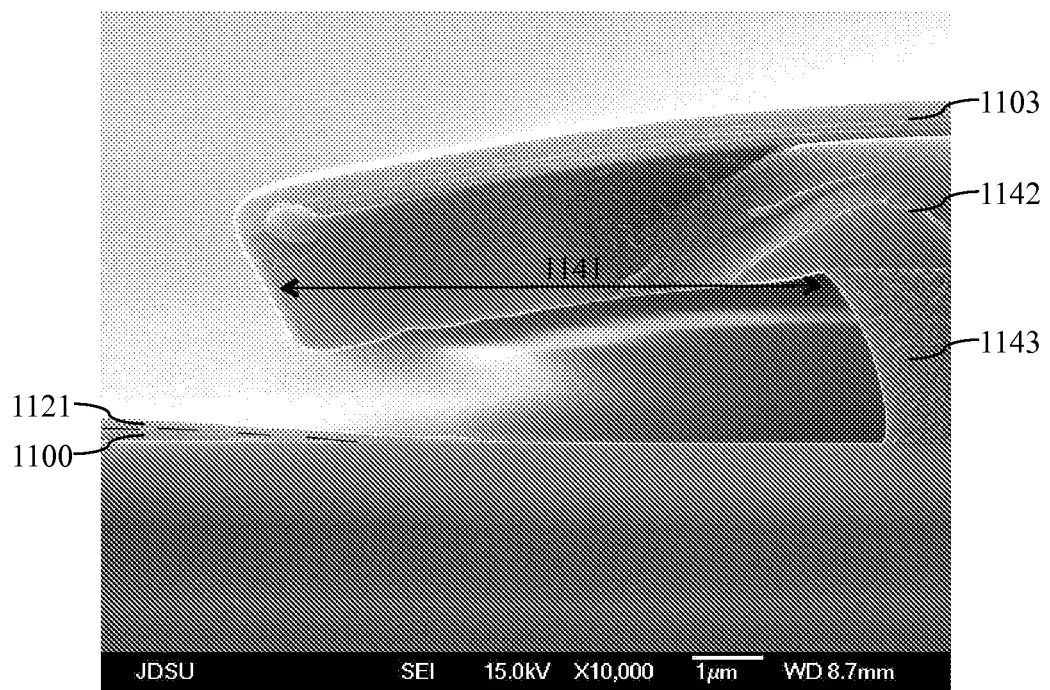
FIGS. 11A and 11B are scanning electron micrographs of a cross-section of a non-continuous coating deposited on a patterned photoresist layer, having a thicker bottom release layer and a larger overhang, and a substrate.
Figure 11B:
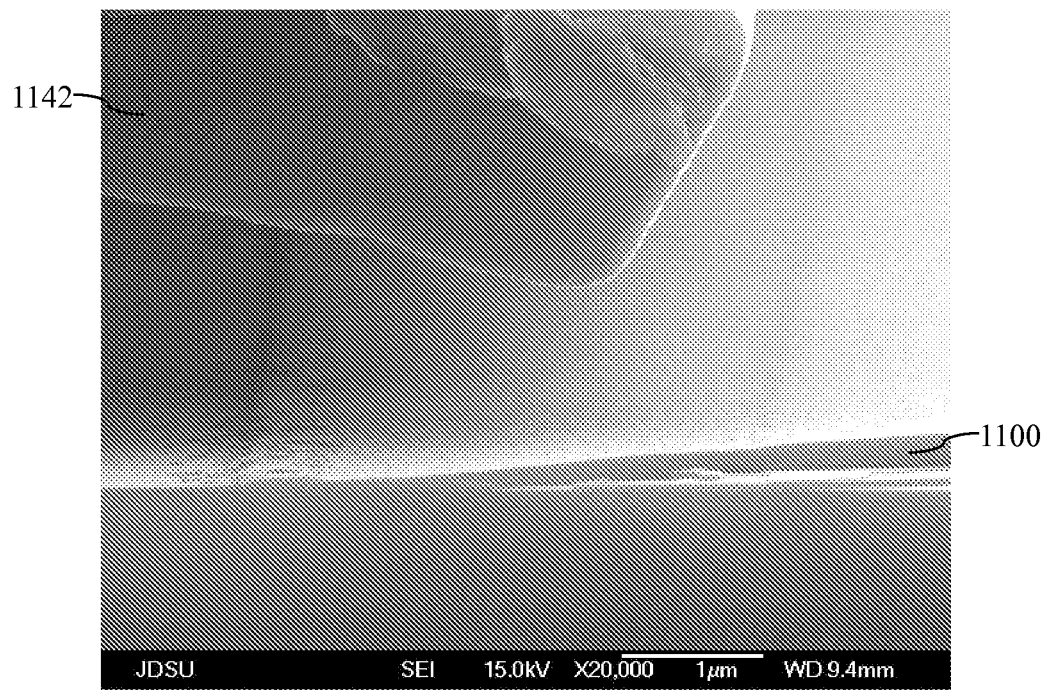

With reference to FIG. 11, in some instances, a thicker bottom release layer 1143 is used, and a larger overhang 1141 is produced by using a longer development time, e.g., about 80 s to about 100 s for some processes. These features improve edge durability by decreasing the slope of the sides of the optical filter 1100 and increasing the thickness of the top dielectric layer 1121 at the periphery of the optical filter 1100. In FIG. 11, the development time was selected to provide an overhang 1141 of about 6 μm. Preferably, the thickness of the bottom release layer 1143 is greater than about 2 μm, and the overhang 1141 is greater than about 4 μm. The thickness of the coating layer 1103 should, generally, be less than about 30% of the thickness of the bottom release layer 1143. In FIG. 11, the thickness of the bottom release layer 1143 is about 2.6 μm, the thickness of the top photosensitive layer 1142 is about 2 μm, and the thickness of the coating 1103 is about 500 nm. The sides of the optical filter 1100 under the overhang 1141 are sloped at an angle of about 5°.

With particular reference to FIG. 1E, in a fourth step, a multilayer stack 103 is deposited as a non-continuous coating onto the patterned photoresist layer 140 and the filter region of the substrate 110. A portion of the multilayer stack 103 disposed on the filter region of the substrate 110 forms the optical filter 100. The layers of the multilayer stack 103, which correspond to the layers of the optical filter 100, may be deposited by using a variety of deposition techniques, such as: evaporation, e.g., thermal evaporation, electron-beam evaporation, plasma-assisted evaporation, or reactive-ion evaporation; sputtering, e.g., magnetron sputtering, reactive sputtering, alternating-current (AC) sputtering, direct-current (DC) sputtering, pulsed DC sputtering, or ion-beam sputtering; chemical vapor deposition, e.g., plasma-enhanced chemical vapor deposition; and atomic layer deposition. Moreover, different layers may be deposited by using different deposition techniques. For example, the metal layers 130 may be deposited by sputtering of a metal target, and the dielectric layers 120 may be deposited by reactive sputtering of a metal target in the presence of oxygen.

Because the overhang 141 shadows a periphery of the filter region of the substrate 110, the deposited layers taper off in thickness towards the periphery 101 of the optical filter 100. The overhang 141 generates a soft roll-off of the coating towards the periphery 101 of the optical filter 100. When a dielectric layer 120 is deposited onto a metal layer 130, the dielectric layer 120 covers not only the top surface of the metal layer 130, but also the tapered edges 131 of the metal layer 130, thereby, protecting the metal layer 130 from the environment. Moreover, the top dielectric layer 120, generally, serves as a protective layer for the metal layers 130 below. For example, in the embodiment of FIG. 11, a top dielectric layer 1121 having a thickness of about 100 nm extends over and protectively covers the less durable metal layers below, in particular, the tapered edges of the metal layers, as shown in FIG. 11A.

Figure 1F:
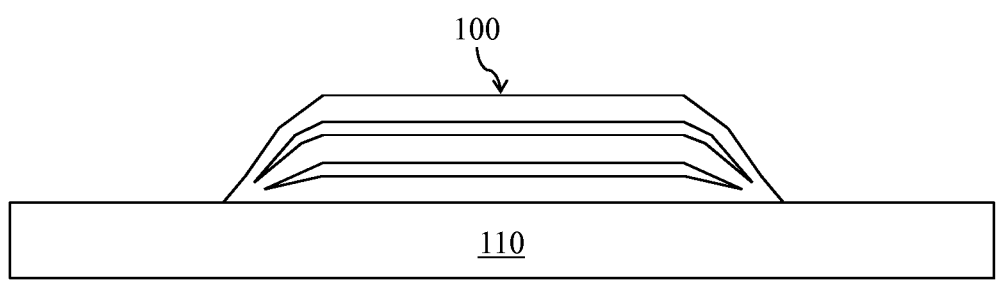

With particular reference to FIG. 1F, in a fifth step, a portion of the multilayer stack 103 on the patterned photoresist layer 140 is removed, i.e., lifted off, together with the photoresist layer 140. Typically, the photoresist layer 140 is stripped by using a suitable stripper or solvent. A portion of the multilayer stack 103 remaining on the filter region of the substrate 110 forms the optical filter 100. The substrate 110 may, for example, be a conventional sensor element.

It should be noted that the lift-off process of FIGS. 1B to 1F may also be used to simultaneously form a plurality of optical filters 100 of the same type, i.e., having the same optical design, on the substrate 110. Moreover, the lift-off process may be repeated to subsequently form one or more optical filters of a different type, i.e., having a different optical design, on the same substrate 110. In some instances, one or more optical filters that are more environmentally durable may be subsequently formed on the substrate 110 so that they partially overlap with one or more optical filters 100 that are less environmentally durable, as explained in further detail hereafter, by using a lift-off process or, in some instances, by using a dry or wet etching process. Thereby, an optical filter array may be formed on the substrate 110. The substrate 110 may, for example, be a conventional sensor array.

Figure 1G:
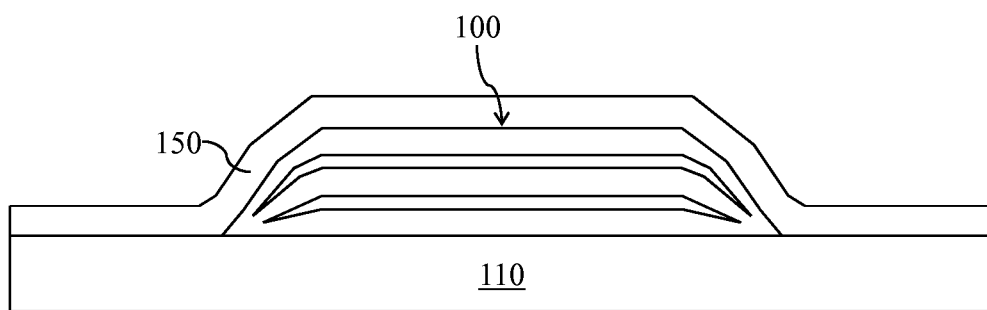

With particular reference to FIG. 1G, in an optional sixth step, an additional protective coating 150 is deposited onto the optical filter 100. The protective coating 150 may be deposited by using one of the deposition techniques mentioned heretofore. The protective coating 150 covers both the central portion 102 and the periphery 101 of the optical filter 100, i.e., all exposed portions of the optical filter 100, thereby, protecting the optical filter 100 from the environment.

Figure 2:
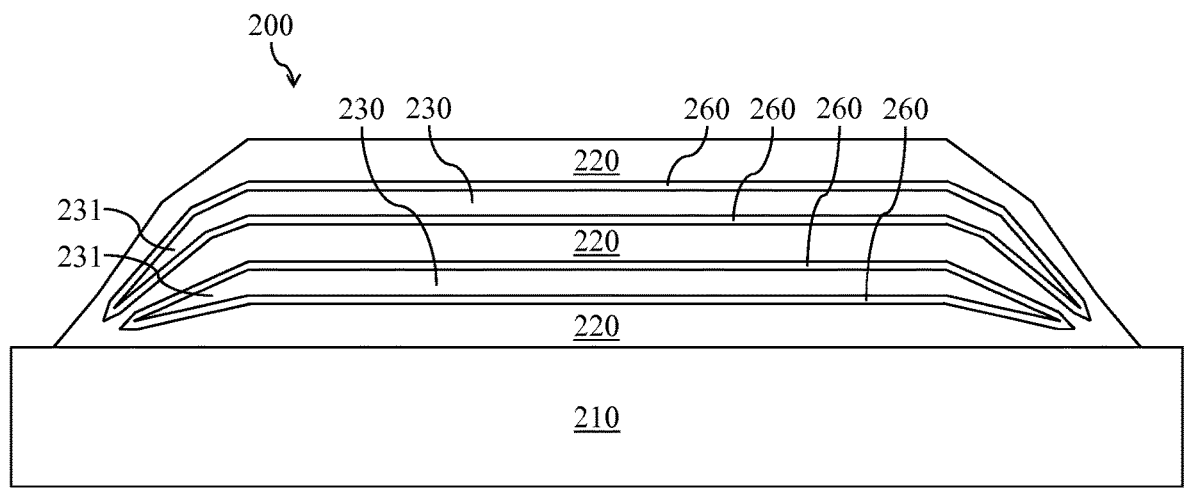
FIG. 2 is a schematic illustration of a cross-section of a second embodiment of an optical filter.

In other embodiments, the optical filter includes a plurality of corrosion-suppressing layers, disposed between the dielectric layers and the metal layers, which further protect the metal layers. With reference to FIG. 2, a second embodiment of the optical filter 200, disposed on a substrate 210, is similar to the first embodiment of the optical filter 100, but further includes four corrosion-suppressing layers 260 inserted between the three dielectric layers 220 and the two metal layers 230.

The metal layers 230 are each disposed between and adjacent to two corrosion-suppressing layers 260 and are, thereby, further protected from the environment. The corrosion-suppressing layers 260 suppress corrosion of the metal layers 230, principally during the deposition process. In particular, the corrosion-suppressing layers 260 protect portions of the metal layers 230 in the optical path, inhibiting degradation of the optical properties of the metal layers 230. Preferably, tapered edges 231 of the metal layers 230 are protectively covered by adjacent corrosion-suppressing layers 260, as well as by nearest dielectric layers 220. Thus, the metal layers 230 are, preferably, substantially encapsulated by adjacent corrosion-suppressing layers 260, as well as by nearest dielectric layers 220.

The second embodiment of the optical filter 200 may be fabricated by a lift-off process similar to that used to fabricate the first embodiment of the optical filter 100. However, the layers of the multilayer stack deposited in the fourth step correspond to the layers of the optical filter 200. In particular, corrosion-suppressing layers 260 are deposited before and after each metal layer 230. Advantageously, the corrosion-suppressing layers 260 suppress corrosion, i.e., oxidation, of the metal layers 230 during deposition of the dielectric layers 220. The corrosion-suppressing layers 260 are particularly useful when the metal layers 230 contain silver or aluminum. In such embodiments, the corrosion-suppressing layers 260 suppress the reaction between silver or aluminum from the metal layers 230 and oxygen from the dielectric layers 220 to form silver oxide or aluminum oxide.

The corrosion-suppressing layers 260 may be deposited as metal compound, e.g., metal nitride or metal oxide, layers by using one of the deposition techniques mentioned heretofore, e.g., reactive sputtering. Alternatively, the corrosion-suppressing layers 260 may be formed by first depositing suitable metal layers, by using one of the deposition techniques mentioned heretofore, and subsequently oxidizing the metal layers. Preferably, the corrosion-suppressing layers 260 on top of the metal layers 230 are each formed by first depositing a suitable metal layer, oxidizing the metal layer, and then depositing a metal oxide layer. For example, these corrosion-suppressing layers 260 may be formed by sputtering of a suitable metal target followed by oxidation, followed by reactive sputtering of a suitable metal target in the presence of oxygen. Further details of methods of forming corrosion-suppressing layers are provided hereafter, and are disclosed in U.S. Pat. No. 7,133,197.

The optical filter of the present invention may have a variety of optical designs. The optical designs of exemplary optical filters will be described in further detail hereafter. In general, the optical design of the optical filter is optimized for a particular passband by selecting suitable layer numbers, materials, and/or thicknesses.

The optical filter includes at least one metal layer, and at least one dielectric layer. Often, the optical filter includes a plurality of metal layers and a plurality of dielectric layers. Typically, the optical filter includes 2 to 6 metal layers, 3 to 7 dielectric layers, and, optionally, 4 to 12 corrosion-suppressing layers. In general, increasing the number of metal layers provides a passband with steeper edges, but with a lower in-band transmittance.

The first or bottom layer in the optical design, i.e., the first layer deposited on the substrate, may be a metal layer or a dielectric layer. The last or top layer in the optical design, i.e., the last layer deposited on the substrate, is usually a dielectric layer. When the bottom layer is a metal layer, the optical filter may consist of n metal layers (M) and n dielectric layers (D) stacked in a sequence of $(M/D)_n$, where $n \geq 1$. Alternatively, the optical filter may consist of n metal layers (M), n dielectric layers (D), and 2n corrosion-suppressing layers (C), stacked in a sequence of $(C/M/C/D)_n$, where $n \geq 1$. When the bottom layer is a dielectric layer, the optical filter may consist of n metal layers (M) and n+1 dielectric layers (D) stacked in a sequence of D(M/D)$_n$, where n≥1. Alternatively, the optical filter may consist of n metal layers (M), n+1 dielectric layers (D), and 2n corrosion-suppressing layers (C), stacked in a sequence of D(C/M/C/D)$_n$, where n≥1.

The metal layers are each composed of a metal or alloy. In some embodiments, the metal layers are each composed of silver. Alternatively, the metal layers may each be composed of a silver alloy. For example, a silver alloy consisting essentially of about 0.5 wt % gold, about 0.5 wt % tin, and a balance of silver may provide improved corrosion resistance. In other embodiments, the metal layers are each composed of aluminum. The choice of metal or alloy depends on the application. Silver is usually preferred for optical filters having a passband in the visible spectral region, and aluminum is usually preferred for optical filters having a passband in the UV spectral region, although silver may sometimes be used when the passband is centered at a wavelength greater than about 350 nm.

Generally, but not necessarily, the metal layers are composed of the same metal or alloy, but have different thicknesses. Typically, the metal layers each have a physical thickness between about 5 nm and about 50 nm, preferably, between about 10 nm and about 35 nm.

The dielectric layers are each composed of a dielectric material that is transparent in the passband of the optical filter.

For optical filters with a passband in the visible spectral region, the dielectric layers are, typically, each composed of a high-index dielectric material having a refractive index greater than about 1.65 at 550 nm that is transparent in the visible spectral region. Suitable examples of high-index dielectric materials for such filters include titanium dioxide (TiO$_2$), zirconium dioxide (ZrO$_2$), hafnium dioxide (HfO$_2$), niobium pentoxide (Nb$_2$O$_5$), tantalum pentoxide (Ta$_2$O$_5$), and mixtures thereof. Preferably, the high-index dielectric material for such filters is also UV-absorbing, i.e., absorbing in the near-UV spectral region. For example, a high-index dielectric material including or consisting of TiO$_2$ and/or Nb$_2$O$_5$ may provide enhanced UV blocking, i.e., lower out-of-band transmittance in the near-UV spectral region. Preferably, the high-index dielectric material has a refractive index greater than about 2.0 at 550 nm, more preferably, greater than about 2.35 at 550 nm. A higher refractive index is usually desirable. However, the transparent high-index dielectric materials that are currently available, generally, have refractive indices less than about 2.7 at 550 nm.

For filters with a passband in the UV spectral region, the dielectric layers are, typically, each composed of an intermediate-index dielectric material having a refractive index between about 1.4 and 1.65 at 300 nm or, preferably, of a high-index dielectric material having a refractive index greater than about 1.65 at 300 nm, more preferably, greater than about 2.2 at 300 nm that is transparent in the UV spectral region. Suitable examples of intermediate-index and high-index dielectric materials for filters with a passband in the UV spectral region include Ta$_2$O$_5$, hafnium dioxide (HfO$_2$), aluminum trioxide (Al$_2$O$_3$), silicon dioxide (SiO$_2$), scandium trioxide Sc$_2$O$_3$, yttrium trioxide (Y$_2$O$_3$), ZrO$_2$, magnesium dioxide (MgO$_2$), magnesium difluoride (MgF$_2$), other fluorides, and mixtures thereof. For example, Ta$_2$O$_5$ may be used as a high-index dielectric material for passbands centered at wavelengths above about 340 nm, and HfO$_2$ may be used as a high-index dielectric material for passbands centered at wavelengths below about 400 nm.

Generally, but not necessarily, the dielectric layers are composed of the same dielectric material, but have different thicknesses. Typically, the dielectric layers each have a physical thickness between about 20 nm and about 300 nm. Preferably, the top dielectric layer has a physical thickness of greater than about 40 nm, more preferably, greater than about 100 nm, to enable the top dielectric layer to serve as a protective layer for the metal layers below. The physical thickness of each dielectric layer is selected to correspond with a quarter wave optical thickness (QWOT) required by an optical design. The QWOT is defined as 4 nt, where n is the refractive index of the dielectric material and t is the physical thickness. Typically, the dielectric layers each have a QWOT between about 200 nm and about 2400 nm.

The optional corrosion-suppressing layers are each composed of a corrosion-suppressing material. Typically, the corrosion-suppressing layers are composed of a corrosion-suppressing dielectric material. Examples of suitable corrosion-suppressing dielectric materials include silicon nitride (Si$_3$N$_4$), TiO$_2$, Nb$_2$O$_5$, zinc oxide (ZnO), and mixtures thereof. Preferably, the corrosion-suppressing dielectric material is a compound, e.g., a nitride or an oxide, of a metal having a higher galvanic potential than the metal or alloy of the metal layers.

In some instances, the corrosion-suppressing layers below the metal layers are composed of ZnO, whereas the corrosion-suppressing layers above the metal layers include a very thin layer, e.g., having a thickness of less than 1 nm, composed of zinc, and a thin layer composed of ZnO. The zinc layers are deposited on the metal layers, and then post-oxidized to prevent optical absorption. The ZnO layers below and above the metal layers are, typically, deposited by reactive sputtering. Advantageously, depositing the zinc layers on the metal layers before depositing the ZnO layers prevents the metal layers from being exposed to the activated, ionized oxygen species that are produced during reactive sputtering. The zinc layers preferentially absorb oxygen, suppressing the oxidation of the metal layers.

The corrosion-suppressing layers are, generally, suitably thin to substantially avoid contributing to the optical design of the optical filter, especially when they are absorbing in the visible spectral region. Typically, the corrosion-suppressing layers each have a physical thickness between about 0.1 nm and about 10 nm, preferably, between about 1 nm and about 5 nm. Further details of suitable corrosion-suppressing layers are disclosed in U.S. Pat. No. 7,133,197.

The optional protective coating is, typically, composed of a dielectric material. The protective coating may be composed of the same dielectric materials and may have the same range of thicknesses as the dielectric layers. Often, the protective coating is composed of the same dielectric material as the top dielectric layer and has a thickness that is a portion of the design thickness, i.e., the thickness required by the optical design, of the top dielectric layer. In other words, the top dielectric layer of the optical design is split between a dielectric layer and a dielectric protective coating. Alternatively, the protective coating may be composed of an organic material, e.g., epoxy.

Figure 3:
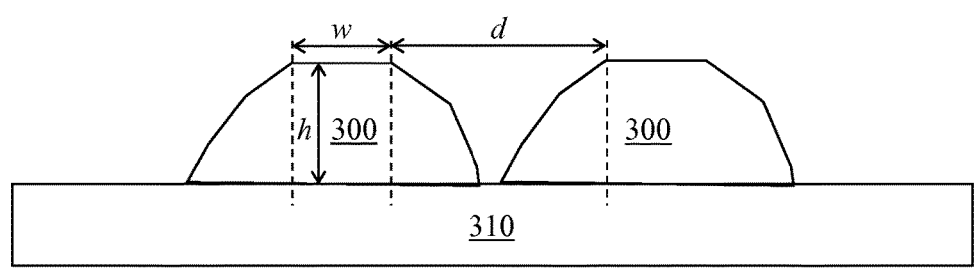
FIG. 3 is a schematic illustration of a cross-section of a plurality of optical filters.

With reference to FIG. 3, the optical filter 300, typically, has a filter height h, i.e., a height of the central portion of the optical filter 300 from the substrate 310, of less than 1 µm, preferably, of less than 0.6 µm. It should be noted that the filter height, generally, corresponds to the thickness of the deposited coating referred to heretofore. When used in a image sensor, the optical filter 300, typically, has a filter width w, i.e., a width of the central portion of the optical filter 300, of less than 2 µm, preferably, of less than 1 µm.

Advantageously, the relatively small filter height allows a smaller filter spacing when a plurality of optical filters 300 are formed by a lift-off process. Typically, the optical filters 300 in an image sensor have a filter spacing d, i.e., a spacing between the central portions of nearest optical filters 300, of less than 2 μm, preferably, of less than 1 μm. When used in other sensor devices with larger pixel sizes, the filter width may be from about 50 μm to about 100 μm.

The optical filter is a metal-dielectric bandpass filter, i.e., an induced transmission filter, having a high in-band transmittance and a low out-of-band transmittance. In some embodiments, the optical filter is a color filter having a relatively narrow color passband in the visible spectral region. For example, the optical filter may be a red, green, blue, cyan, yellow, or magenta filter. In other embodiments, the optical filter is a photopic filter having a photopic passband, i.e., a passband matching the photopic luminosity efficiency function that mimics the spectral response of the human eye to relatively bright light, in the visible spectral region. In yet other embodiments, the optical filter is an IR-blocking filter having a relatively broad passband in the visible spectral region.

In such embodiments, the optical filter, typically, has a maximum in-band transmittance of greater than about 50%, an average out-of-band transmittance of less than about 2% between about 300 nm and about 400 nm, i.e., in the near-UV spectral region, and an average out-of-band transmittance of less than about 0.3% between about 750 nm and about 1100 nm, i.e., in the infrared (IR) spectral region. In contrast, conventional all-dielectric color and photopic filters are not, typically, inherently IR-blocking. Generally, in such embodiments, the optical filter also has a low angle shift, i.e., center-wavelength shift with change in incidence angle from 0°. Typically, the optical filter has an angle shift at an incidence angle of 60° of less than about 5% or about 30 nm in magnitude for an optical filter centered at 600 nm. In contrast, conventional all-dielectric color and photopic filters are, typically, very angle-sensitive.

Optical designs, i.e., layer numbers, materials, and thicknesses, for exemplary red, green, and blue filters, i.e., an exemplary RGB filter set, are tabulated in FIGS. 4A, 4B, and 4C, respectively. An optical design for an exemplary photopic filter is tabulated in FIG. 4D. The layers of each optical design are numbered starting from the first or bottom layer deposited on the substrate.

The metal layers are each composed of silver, and have physical thicknesses between about 13 nm and about 34 nm. The dielectric layers are each composed of a high-index dielectric material (H), and have QWOTs between about 240 nm and about 2090 nm. For example, the high-index dielectric material may be a mixture of $Nb_2O_5$ and $TiO_2$ having a refractive index of about 2.43 at 550 nm. The corrosion-suppressing layers are each composed of ZnO and each have a physical thickness of about 2 nm.

When the high-index dielectric material has a refractive index of about 2.43 at 550 nm, the filter height of the red filter is 606 nm, that of the green filter is 531 nm, that of the blue filter is 252 nm, and that of the photopic filter is 522 nm. These filter heights are considerably smaller than those of conventional all-dielectric color and photopic filters.

Figure 5A:
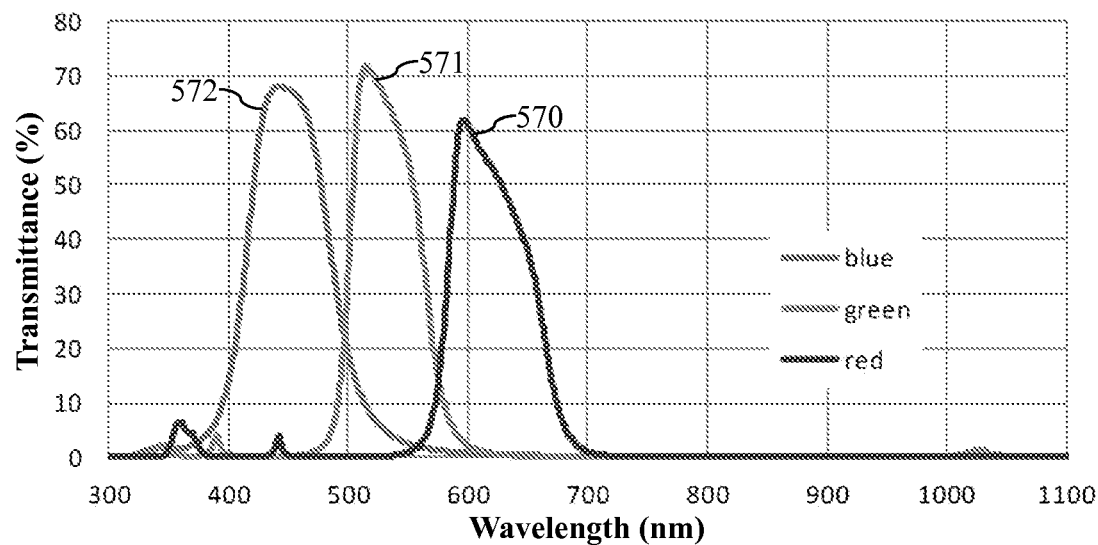
FIGS. 5A and 5B are plots of transmission spectra for the exemplary red, green, and blue filters of FIGS. 4A to 4C.
Figure 5B:
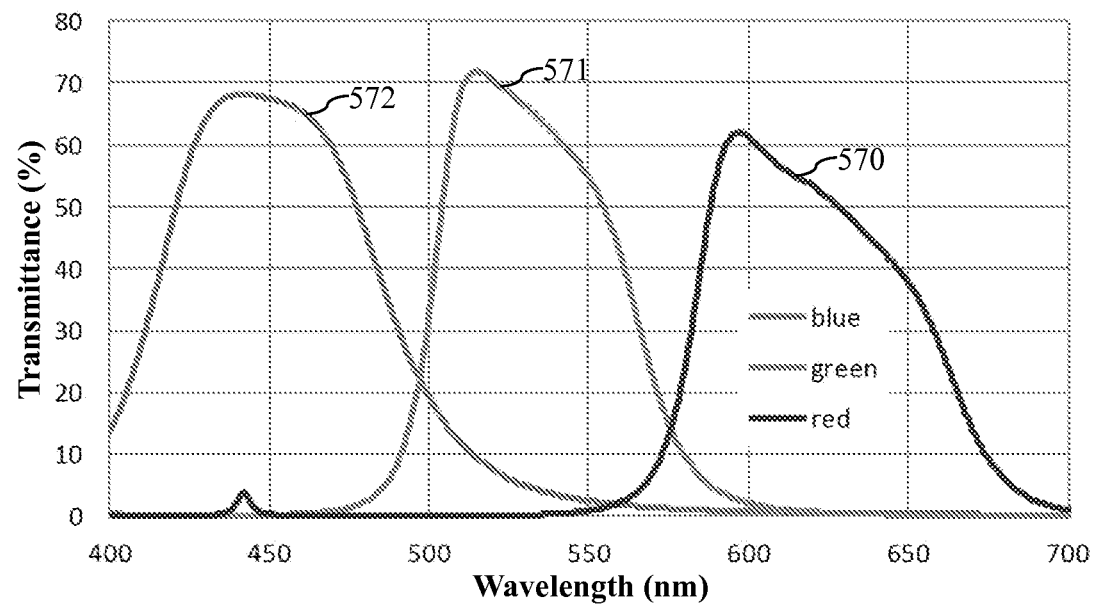

Transmission spectra 570, 571, and 572 for the exemplary red, green, and blue filters, respectively, are plotted in FIGS. 5A and 5B. The transmission spectrum 570 for the exemplary red filter includes a red passband centered at about 620 nm, the transmission spectrum 571 for the exemplary green filter includes a green passband centered at about 530 nm, and the transmission spectrum 572 for the exemplary blue filter includes a blue passband centered at about 445 nm.

Figure 5C:
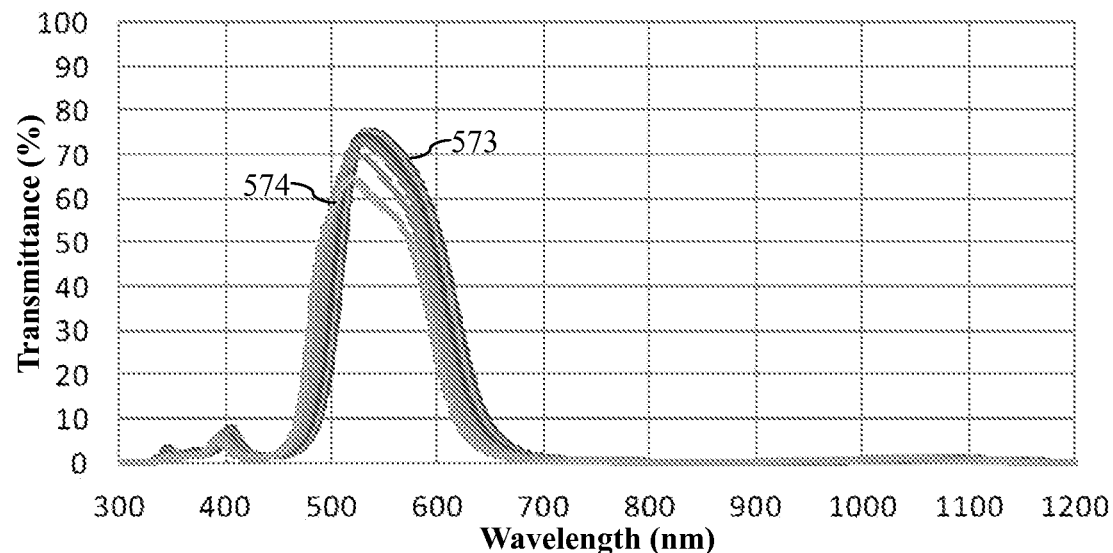
FIG. 5C is a plot of transmission spectra at incidence angles of 0° to 60° for the exemplary photopic filter of FIG. 4D.

Transmission spectra 573 (0°) and 574 (60°) for the exemplary photopic filter at incidence angles of 0° to 60° are plotted in FIG. 5C. The transmission spectrum 573 for the exemplary photopic filter at an incidence angle of 0° includes a photopic passband centered at about 555 nm. In the transmission spectrum 574 for the exemplary photopic filter at an incidence angle of 60°, the photopic passband is centered at about 520 nm. In other words, the angle shift of the exemplary photopic filter at an incidence angle of 60° is about −25 nm. Advantageously, the angle shift of the exemplary photopic filter is considerably smaller than the angle shift of a conventional all-dielectric photopic filter.

The exemplary color and photopic filters each have a maximum in-band transmittance of greater than about 60%. Advantageously, the exemplary color and photopic filters provide improved IR blocking relative to conventional dye-based and all-dielectric color and photopic filters, reducing noise caused by IR leaking. Specifically, the exemplary color and photopic filters each have an average out-of-band transmittance of less than about 0.3% between about 750 nm and about 1100 nm, i.e., in the IR spectral region. The exemplary color and photopic filters, particularly the exemplary red filter, also provide improved UV blocking relative to some conventional metal-dielectric color filters, reducing noise caused by UV leaking. Specifically, the exemplary color and photopic filters each have an average out-of-band transmittance of less than about 2% between about 300 nm and about 400 nm, i.e., in the near-UV spectral region.

Figure 6A:
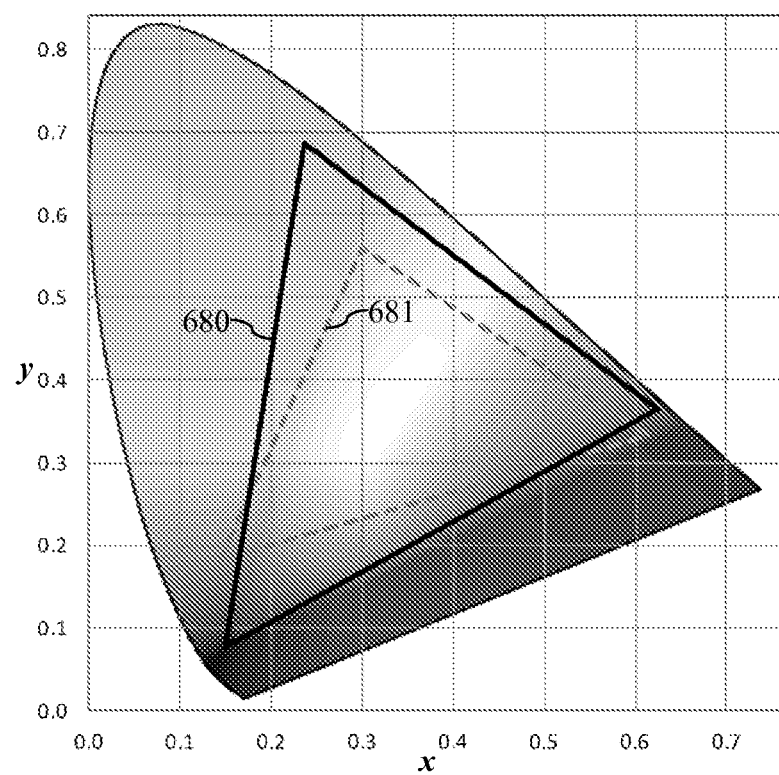
FIG. 6A is a plot of color gamuts for the exemplary red, green, and blue (RGB) filter set of FIGS. 4A to 4C and for a conventional dye-based RGB filter set.

A color gamut 680 for the exemplary RGB filter set is plotted on a CIE xy chromaticity diagram in FIG. 6A, along with a color gamut 681 for a conventional dye-based RGB filter set for comparison. Advantageously, the color gamut 680 of the exemplary RGB filter set is considerably larger than the color gamut 681 of the conventional dye-based RGB filter set.

Figure 6B:
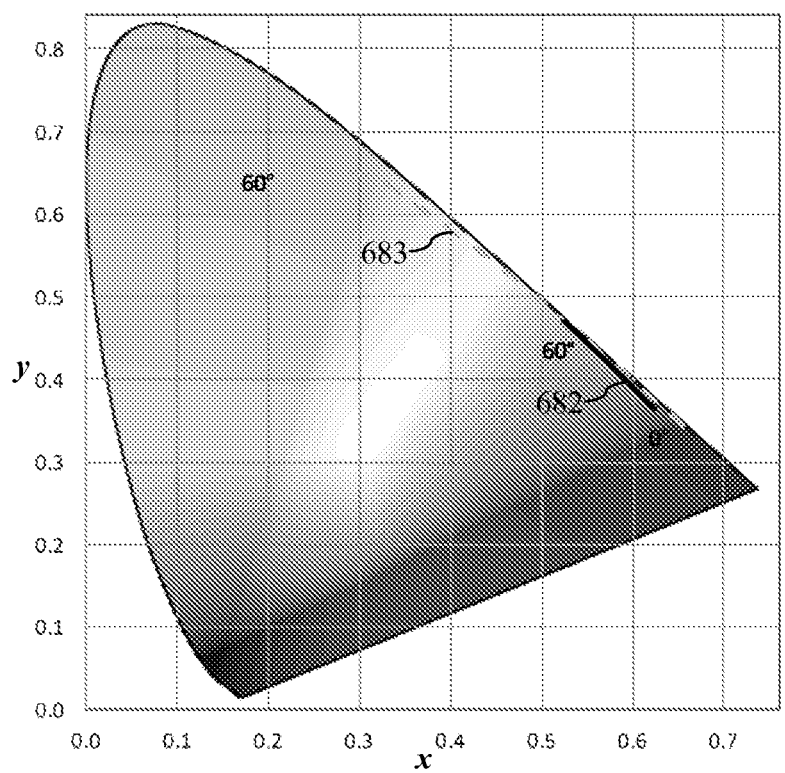
FIG. 6B is a plot of color trajectories at incidence angles of 0° to 60° for the exemplary red filter of FIG. 4A and for a conventional all-dielectric red filter.
Figure 6C:
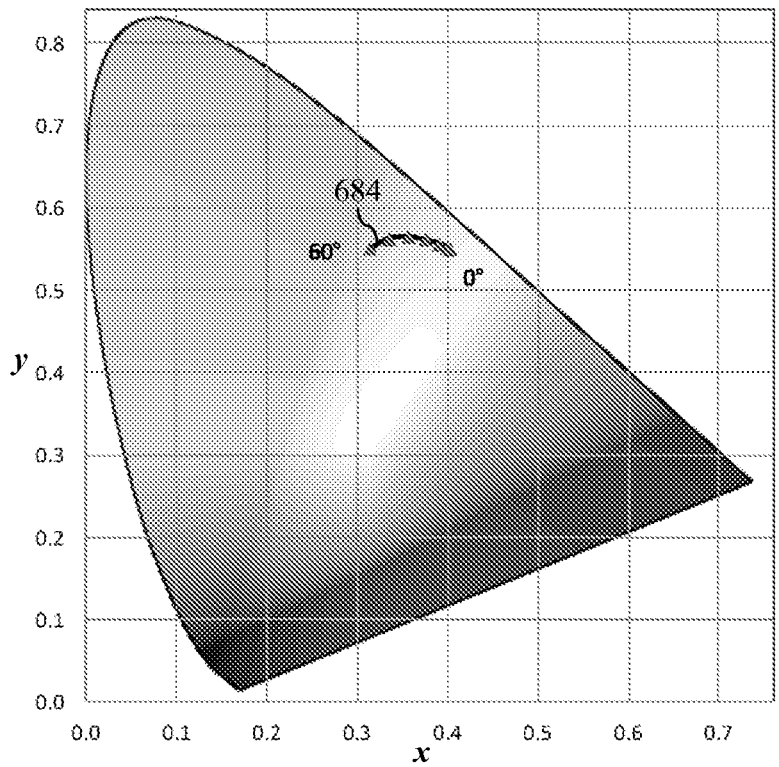
FIG. 6C is a plot of a color trajectory at incidence angles of 0° to 60° for the exemplary photopic filter of FIG. 4D.

A color trajectory 682 for the exemplary red filter at incidence angles of 0° to 60° is plotted on a CIE xy chromaticity diagram in FIG. 6B, along with a color trajectory 683 for a conventional all-dielectric red filter at incidence angles of 0° to 60°. A color trajectory 684 for the exemplary photopic filter at incidence angles of 0° to 60° is plotted on a CIE xy chromaticity diagram in FIG. 6C. Advantageously, the angle shift of the exemplary red and photopic filters is considerably smaller than the angle shift of conventional all-dielectric red and photopic filters.

In some embodiments, the optical filter is a UV filter having a relatively narrow passband in the UV spectral region, e.g., between about 180 nm and about 420 nm. For example, the optical filter may be an ultraviolet-A (UVA) or ultraviolet-B (UVB) filter. In such embodiments, the optical filter typically, has a maximum in-band transmittance of greater than about 5%, preferably, greater than about 15%, and an average out-of-band transmittance of less than about 0.3% between about 420 nm and about 1100 nm, i.e., in the visible and IR spectral regions. In contrast, conventional all-dielectric UV filters are not, typically, inherently IR-blocking. Generally, in such embodiments, the optical filter also has a low angle shift, i.e., center-wavelength shift with change in incidence angle from 0°. Typically, the optical filter has an angle shift at an incidence angle of 60° of less than about 5% or about 15 nm in magnitude for an optical filter centered at 300 nm. In contrast, conventional all-dielectric UV filters are, typically, very angle-sensitive.

Optical designs, i.e., layer numbers, materials, and thicknesses, for exemplary UVA, UVB, and 220-nm-centered filters are summarized in FIG. 12. The metal layers are each composed of aluminum, and have physical thicknesses between about 10 nm and about 20 nm. The dielectric layers are each composed of a high-index dielectric material, namely, $Ta_2O_5$ for the UVA filter, and $HfO_2$ for the UVB and 220-nm-centered filters, and have physical thicknesses between about 40 nm and about 60 nm. The exemplary UV filters do not include corrosion-suppressing layers, as the additional protection they provide is not usually necessary when the metal layers are composed of aluminum.

The filter height of the UVA filter is 350 nm, that of the UVB filter is 398 nm, and that of the 220-nm-centered filter is 277 nm. These filter heights are considerably smaller than those of conventional all-dielectric UV filters.

Figure 13A:
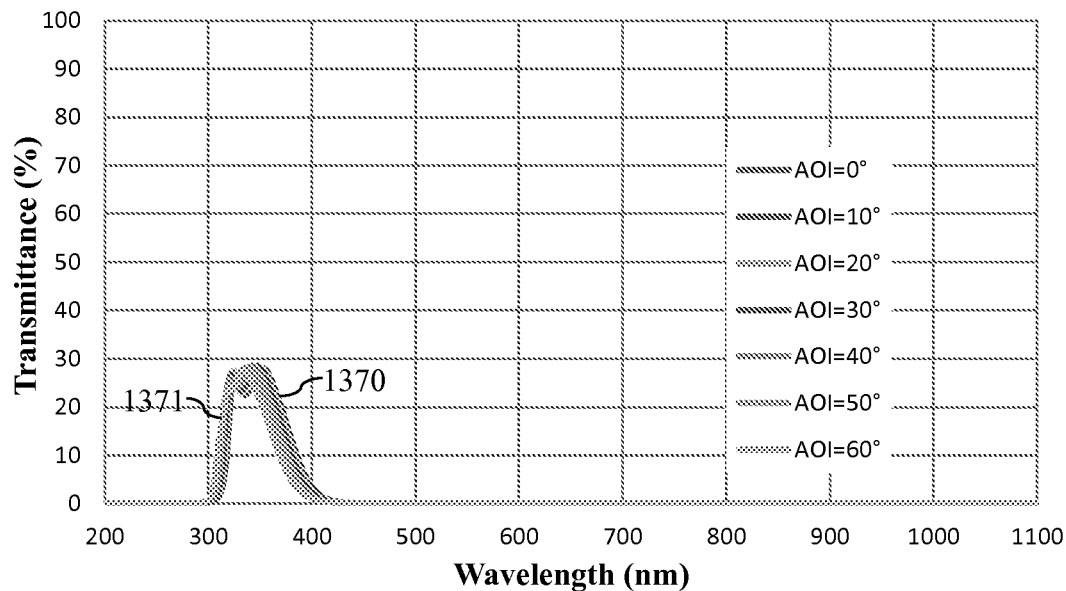
FIG. 13A is a plot of transmission spectra at incidence angles of 0° to 60° for the exemplary UVA filter of FIG. 12.
Figure 13B:
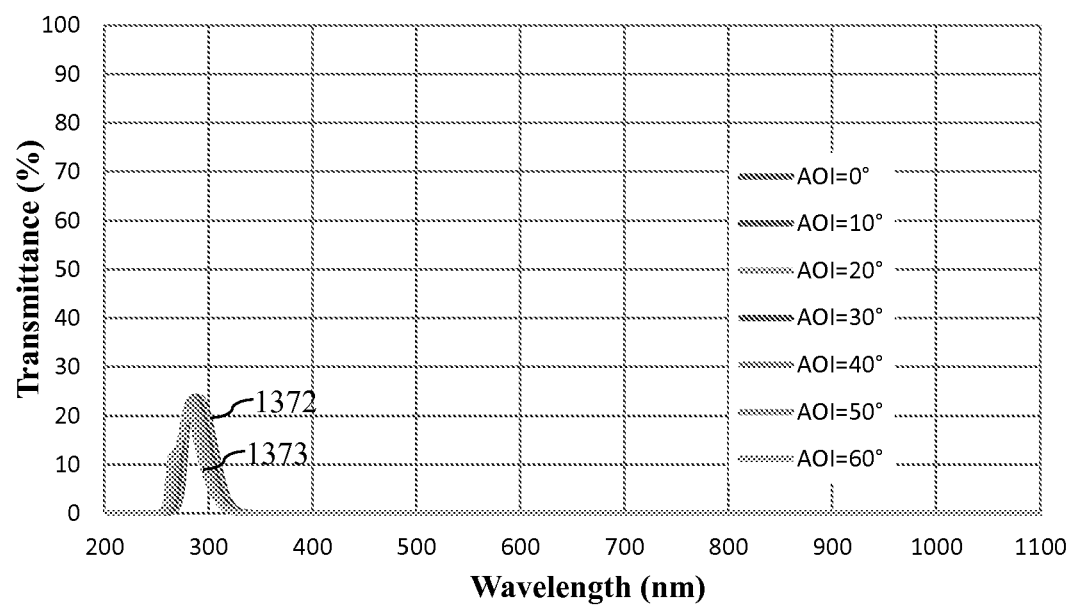
FIG. 13B is a plot of transmission spectra at incidence angles of 0° to 60° for the exemplary UVB filter of FIG. 12.
Figure 13C:
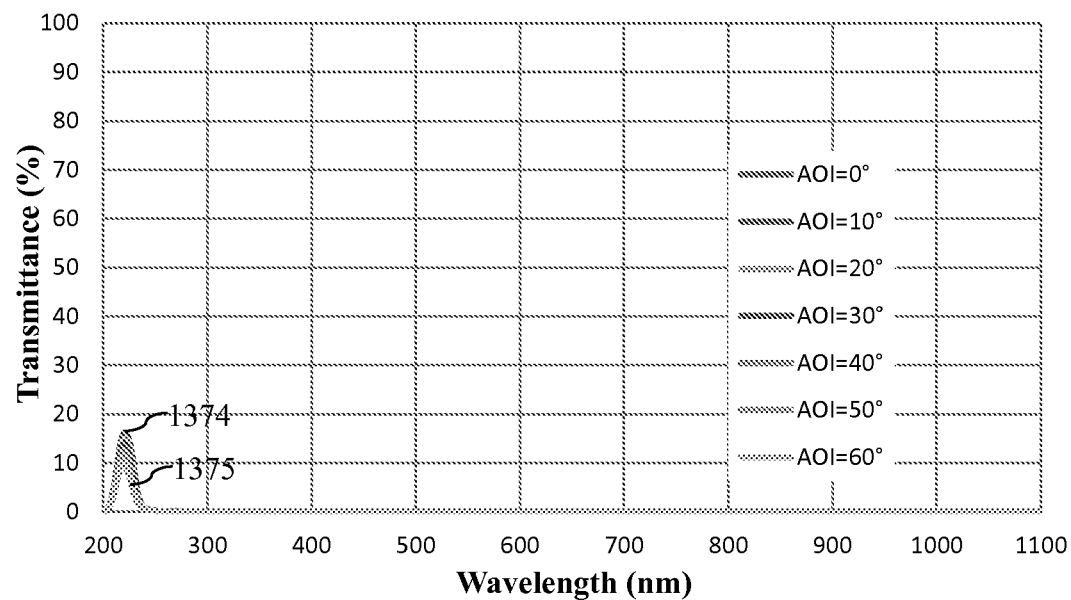
FIG. 13C is a plot of transmission spectra at incidence angles of 0° to 60° for the exemplary 220-nm-centered filter of FIG. 12.

Transmission spectra 1370 (0°) and 1371 (60°) for the exemplary UVA filter at incidence angles of 0° to 60° are plotted in FIG. 13A, transmission spectra 1372 (0°) and 1373 (60°) for the exemplary UVB filter at incidence angles of 0° to 60° are plotted in FIG. 13B, and transmission spectra 1374 (0°) and 1375 (60°) for the exemplary 220-nm-centered filter at incidence angles of 0° to 60° are plotted in FIG. 13C. The transmission spectrum 1370 for the exemplary UVA filter at an incidence angle of 0° includes a UVA passband centered at about 355 nm, the transmission spectrum 1372 for the exemplary UVB filter at an incidence angle of 0° includes a UVB passband centered at about 295 nm, and the transmission spectrum 1374 for the 220-nm-centered filter at an incidence angle of 0° includes a passband centered at about 220 nm. The angle shift of the exemplary UV filters at an incidence angle of 60° is less than about 15 nm in magnitude. Advantageously, the angle shift of the exemplary UV filters is considerably smaller than the angle shift of conventional all-dielectric UV filters.

The exemplary UV filters each have a maximum in-band transmittance of greater than about 10%. In particular, the UVA and UVB filters each have a maximum in-band transmittance of greater than about 20%. Advantageously, the exemplary UV filters provide improved IR blocking relative to conventional all-dielectric UV filters, reducing noise caused by IR leaking. Specifically, the exemplary UV filters each have an average out-of-band transmittance of less than about 0.3% between about 420 nm and about 1100 nm, i.e., in the visible and IR spectral regions.

The optical filter of the present invention is particularly useful when included as part of a sensor device or other active device. The sensor device may be any type of sensor device including one or more sensor elements, in addition to one or more optical filters according to the present invention. In some instances, the sensor device may also include one or more conventional optical filters. For example, the sensor device may be an image sensor, an ambient light sensor, a proximity sensor, an hue sensor, a UV sensor, or a combination thereof. The one or more sensor elements may be any type of conventional sensor elements. Typically, the one or more sensor elements are photodetectors, such as photodiodes, charge-coupled device (CCD) sensor elements, complementary metal-oxide semiconductor (CMOS) sensor elements, silicon detectors, or special UV-sensitive detectors. The one or more sensor elements may be front- or back-illuminated. The sensor elements may be formed of any typical sensor material, such as silicon, indium gallium arsenide ($In_{1-x}Ga_xAs$), gallium arsenide (GaAs), germanium, lead sulfide (PbS), or gallium nitride (GaN).

The one or more optical filters are disposed over the one or more sensor elements, so that the one or more optical filters filter light provided to the one or more sensor elements. Typically, each optical filter is disposed over one sensor element. In other words, each pixel of the sensor device, typically, includes one optical filter and one sensor element. Preferably, the one or more optical filters are disposed directly on the one or more sensor elements, e.g., on a passivation layer of the one or more sensor elements. For example, the one or more optical filters may be formed on the one or more sensor elements by a lift-off process. However, in some instances, there may be one or more coatings disposed between the one or more optical filters and the one or more sensor elements. In some instances, the one or more optical filters may be integrated with the one or more sensor elements.

Figure 7:
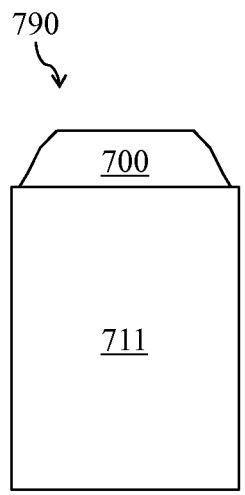
FIG. 7 is a schematic illustration of a cross-section of a first embodiment of a sensor device.

In some embodiments, the sensor device includes a single sensor element and a single optical filter according to the present invention disposed over the sensor element. With reference to FIG. 7, a first embodiment of the sensor device 790 includes a sensor element 711 and an optical filter 700 disposed on the sensor element 711. For example, the sensor device 790 may be an ambient light sensor, the sensor element 711 may be a photodiode, and the optical filter 700 may be a photopic filter, such as the exemplary photopic filter of FIG. 4D, or an IR-blocking filter. For another example, the sensor device 790 may be a UV sensor, the sensor element 711 may be a photodiode, and the optical filter 700 may be a UV filter, such as the exemplary UVA, UVB, or 220-nm-centred filter of FIG. 12.

In an exemplary embodiment of an ambient light sensor, a photopic filter according to the present invention is integrated with a photodiode. The photopic filter is disposed on the photodiode, typically, on a planarized passivation layer, e.g., composed of $Si_3N_4$, of the photodiode. An optional protective coating or encapsulation layer, e.g., composed of epoxy, may be disposed over the photopic filter and the photodiode. The optical design of the photopic filter is optimized by taking the passivation layer and, when present, the encapsulation layer into account.

Figure 14:
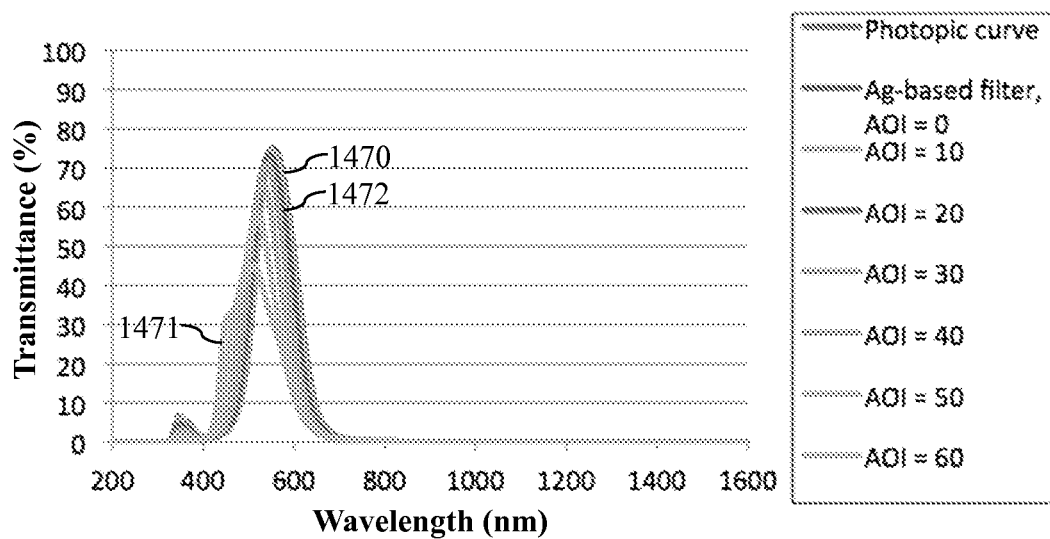
FIG. 14 is a plot of transmission spectra at incidence angles of 0° to 60° for an exemplary photopic filter.

Transmission spectra 1470 (0°) and 1471 (60°) for an exemplary photopic filter optimized for integration with a photodiode at incidence angles of 0° to 60° are plotted in FIG. 14, along with a normalized photopic response curve 1472. The transmission spectra 1470 and 1471 are matched to a $Si_3N_4$ passivation layer and an epoxy encapsulation layer. The transmission spectrum 1470 for the exemplary photopic filter at an incidence angle of 0° includes a photopic passband centered at about 555 nm. The transmission spectra 1470 for the exemplary photopic filter follow the normalized photopic response curve 1472 reasonably well at incidence angles of 0° to 40°. Moreover, the exemplary photopic filter blocks both UV and IR light at incidence angles of 0° to 60°, and has a low angle shift. Advantageously, the exemplary photopic filter is also environmentally durable, e.g., at a temperature of 125° C. and a relative humidity of 100% for 96 hours.

In other embodiments, the sensor device includes a plurality of sensor elements, and a plurality of optical filters according to the present invention disposed over the plurality of sensor elements. Typically, the sensor elements are disposed in an array. In other words, the sensor elements form a sensor array, such as a photodiode array, a CCD array, a CMOS array, or any other type of conventional sensor array. Also typically, the optical filters are disposed in an array. In other words, the optical filters form an optical filter array, such as a color filter array (CFA). Preferably, the sensor array and the optical filter array are corresponding two-dimensional arrays, i.e., mosaics. For example, the arrays may be rectangular arrays having rows and columns.

Often, in such embodiments, the optical filters are substantially separate from one another. In other words, the peripheries of the optical filters are not usually in contact with one another. However, in some instances, the dielectric layers of the optical filters may unintentionally touch, while the metal layers, particularly, the tapered edges, remain separate from one another.

Typically, the plurality of optical filters includes different types of optical filters having different passbands from one another. For example, the plurality of optical filters may include color filters, such as red, green, blue, cyan, yellow, and/or magenta filters, photopic filters, IR-blocking filters, UV filters, or a combination thereof. In some embodiments, the plurality of optical filters includes different types of color filters, forming a CFA. For example, the plurality of optical filters may include red, green, and blue filters, such as the exemplary red, green, and blue filters of FIGS. 4A to 4C, forming an RGB filter array, such as a Bayer filter array. For another example, the plurality of optical filters may include cyan, magenta, and yellow filters, forming a CMY filter array.

Advantageously, the different types of optical filters may have different numbers of metal layers and/or different thicknesses of the metal layers from one another. In some embodiments, at least two of the different types of optical filters include different numbers of metal layers from one another. In the same or other embodiments, at least two of the different types of optical filters have different metal-layer thicknesses from one another. For example, the exemplary blue filter of FIG. 4C has a different number of metal layers from the exemplary red and green filters of FIGS. 4A and 4B. Moreover, all of the exemplary red, green, and blue filters of FIGS. 4A to 4C have different metal-layer thicknesses from one another.

Figure 8:
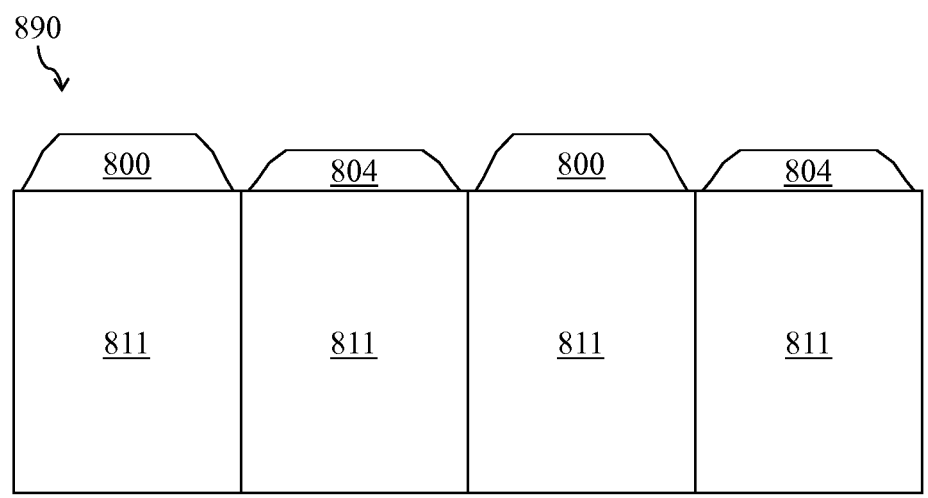
FIG. 8 is a schematic illustration of a cross-section of a second embodiment of a sensor device.

With reference to FIG. 8, a second embodiment of the sensor device 890 includes a plurality of sensor elements 811 and a plurality of optical filters 800 and 804 disposed on the plurality of sensor elements 811. The plurality of optical filters 800 and 804 includes a first type of optical filter 800 having a first passband, and a second type of optical filter 804 having a second passband, different from the first passband. For example, the sensor device 890 may be an image sensor, the plurality of sensor elements 811 may form a CCD array, and the plurality of optical filters 800 and 804 may form a Bayer filter array, of which only a portion of one row is illustrated. The first type of optical filter 800 may be a green filter, such as the exemplary green filter of FIG. 4B, and the second type of optical filter 804 may be a red filter, such as the exemplary red filter of FIG. 4A, or a blue filter, such as the exemplary blue filter of FIG. 4C.

Any of the embodiments of the sensor device described heretofore may be combined with one or more additional optical filters that are more environmentally durable and one or more additional sensor elements.

Accordingly, in some embodiments, the sensor device includes one or more second optical filters disposed over one or more second sensor elements, in addition to one or more first optical filters according to the present invention disposed over one or more first sensor elements. The one or more second optical filters are more environmentally durable than the one or more first optical filters. For example, the one or more first optical filters may be silver-dielectric optical filters according to the present invention, in which the metal layers are composed of silver or a silver alloy. The second one or more second optical filters may be an aluminum-dielectric optical filters according to the present invention, in which the metal layers are composed of aluminum. Alternatively, the one or more second optical filters may be conventional optical filters, such as all-dielectric, silicon-dielectric, or hydrogenated-silicon-dielectric optical filters.

In such embodiments, the one or more second optical filters partially overlap with the one or more first optical filters, such that the one or more second optical filters that are more environmentally durable protectively cover the peripheries of the one or more first optical filters that are less environmentally durable. Advantageously, this overlapping layout provides the one or more first optical filters, particularly, the tapered edges of the metal layers, with additional protection from environmental degradation such as corrosion. Owing to the small slope of the filter sides and the small filter height of the one or more first optical filters, the one or more second optical filters conform when deposited on the sloped sides at the peripheries of the one or more first optical filters and the substrate, providing continuous layers in the one or more second optical filters.

The one or more second optical filters extend over the sloped sides at the peripheries of the one or more first optical filters, including the tapered edges of the metal layers, preferably, along the entire peripheries of the one or more first optical filters. Preferably, the one or more second optical filters completely cover the sloped sides at the peripheries of the one or more first optical filters. However, the one or more second optical filters do not cover or obstruct the one or more first sensor elements.

Typically, the one or more first optical filters and the one or more second optical filters have different passbands from one another. For example, the one or more first optical filters may be color filters, such as red, green, blue, cyan, yellow, or magenta filters, photopic filters, IR-blocking filters, or a combination thereof. In particular, the one or more first optical filters may be silver-dielectric color filters, such as the exemplary red, green, and/or blue filters of FIGS. 4A to 4C, silver-dielectric photopic filters, such as the exemplary photopic filter of FIG. 4D, or silver-dielectric IR-blocking filters.

The one or more second optical filters may, for example, be UV filters or near-IR filters, or a combination thereof. In particular, the one or more second optical filters may be aluminum-dielectric UV filters, such as the exemplary UVA, UVB, and/or 220-nm-centered filters of FIG. 12, or all-dielectric UV filters. Alternatively, the one or more second optical filters may be silicon-dielectric or hydrogenated-silicon-dielectric near-IR filters, such as the optical filters described in U.S. Patent Application Publication No. 2014/0014838 to Hendrix, et al., published on Jan. 16, 2014, which is incorporated herein by reference, or all-dielectric near-IR filters.

Typically, the sensor device, in such embodiments, is multifunctional and combines different types of optical sensors having different functions, mainly determined by the passbands of the one or more first optical filters and the one or more second optical filters. The one or more first optical filters and the one or more first sensor elements form a first type of optical sensor, and the one or more second optical filters and the one or more second sensor elements form a second type of optical sensor. For example, the first type of optical sensor may be an ambient light sensor including a photopic filter or an IR-blocking filter, a hue sensor including one or more different types of color filters, or an image sensor including a plurality of different types of color filters. The second type of optical sensor may, for example, be a UV sensor including a UV filter, or a proximity sensor including a near-IR filter.

With reference to FIG. 15, a third embodiment of a sensor device 1590 includes a first sensor element 1511 and a first optical filter 1500 according to the present invention disposed on the first sensor element 1511, forming a first type of optical sensor. The sensor device 1590 further includes a second sensor element 1512 and a second optical filter 1505 that is more environmentally durable disposed on the second sensor element 1512, forming a second type of optical sensor.

For example, the first type of optical sensor may be an ambient light sensor, and the first optical filter 1500 may be a silver-dielectric photopic filter, such as the exemplary photopic filter of FIG. 4D, or a silver-dielectric IR-blocking filter. The second type of optical sensor may, for example, be a UV sensor, and the second optical filter 1505 may be an aluminum-dielectric UV filter, such as the exemplary UVA, UVB, or 220-nm-centered filter of FIG. 12, or an all-dielectric UV filter. Alternatively, the second type of optical sensor may be a proximity sensor, and the second optical filter 1505 may be a near-IR filter, such as an all-dielectric, silicon-dielectric, or hydrogenated-silicon-dielectric near-IR filter. The first sensor element 1511 and the second sensor element 1512 may be photodiodes.

Figure 15A:
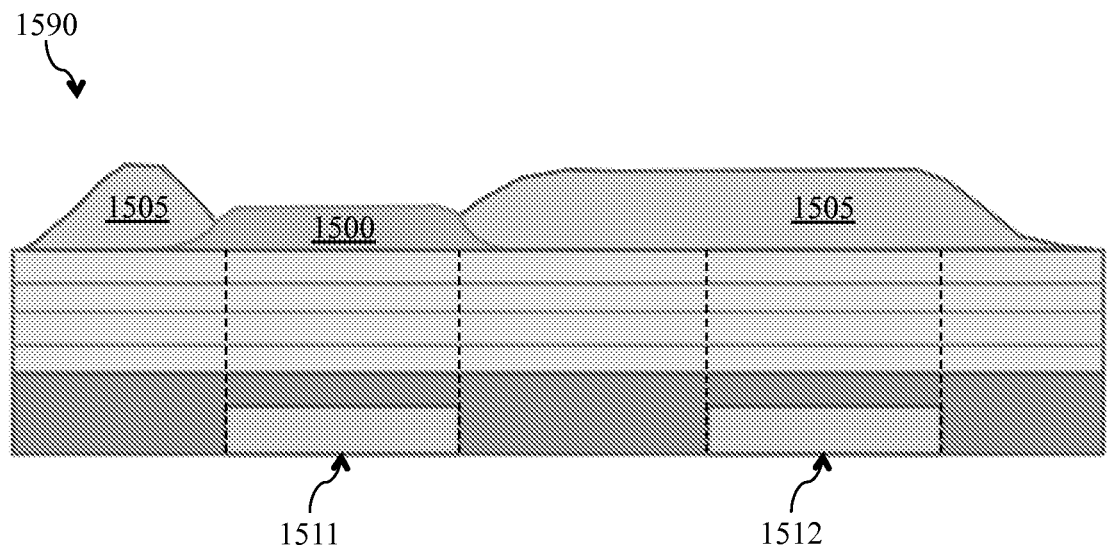
FIG. 15A is a schematic illustration of a cross-section of a third embodiment of a sensor device.

With particular reference to FIG. 15A, the second optical filter 1505 extends over the sloped sides of the first optical filter 1500 along the entire periphery of the first optical filter 1500. Thereby, the second optical filter 1505 protectively covers the periphery of the first optical filter 1500, including the tapered edges of the metal layers.

Figure 15B:
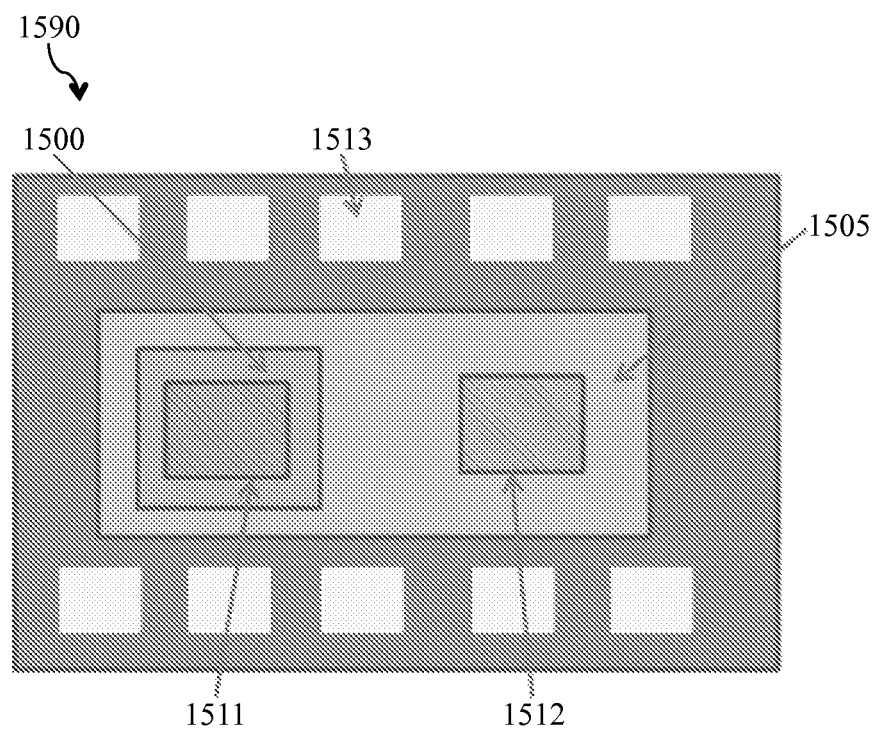
FIG. 15B is a schematic illustration of a top view of the sensor device of FIG. 15A.
Figure 15C:
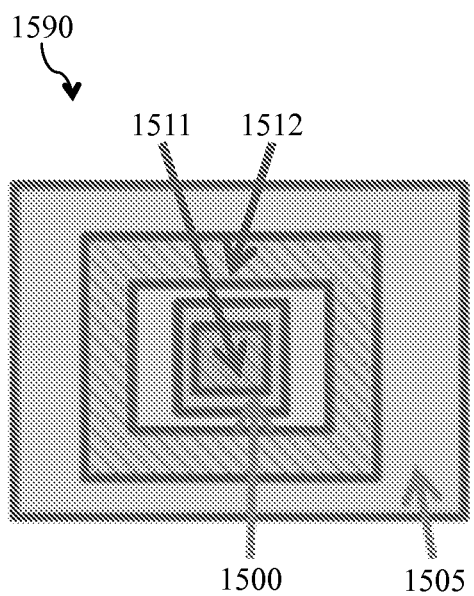
FIG. 15C is a schematic illustration of a top view of an alternative layout for the sensor device of FIG. 15A.

With particular reference to FIGS. 15B and 15C, the first optical filter 1500 covers and filters light provided to the first sensor element 1511. The second optical filter 1505 covers and filters light provided to the second sensor element 1512, and surrounds, but does not cover, the first sensor element 1511. In the layout illustrated in FIG. 15B, the first sensor element 1511 and the second sensor element 1512 are disposed in a row between rows of bond pads 1513. In an alternative layout illustrated in FIG. 15C, the second sensor element 1512 is annular and surrounds the first sensor element 1511.

Figure 16:
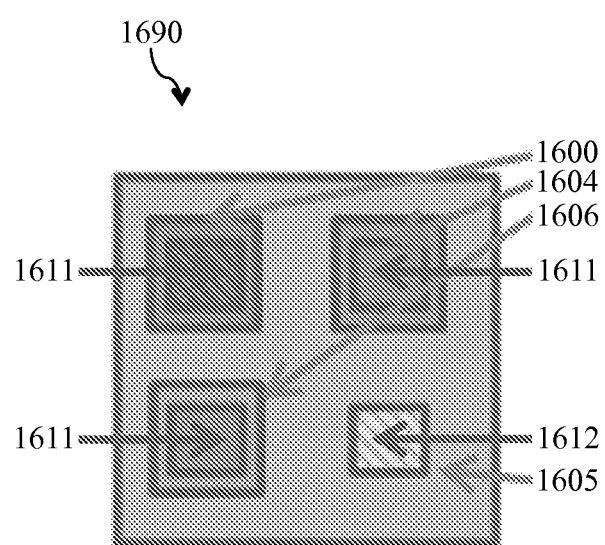
FIG. 16 is a schematic illustration of a top view of a fourth embodiment of a sensor device.

With reference to FIG. 16, a fourth embodiment of a sensor device 1690 includes a plurality of first sensor elements 1611 and a plurality of first optical filters 1600, 1604, and 1606 according to the present invention disposed on the plurality of first sensor elements 1611, forming a first type of optical sensor. The sensor device 1690 further includes a second sensor element 1612 and a second optical filter 1605 disposed over the second sensor element 1612, forming a second type of optical sensor.

For example, the first type of optical sensor may be an image sensor or a hue sensor, and the plurality of first optical filters 1600, 1604, and 1606 may be different types of color filters, such as the exemplary silver-dielectric red, green, and blue filters of FIGS. 4A to 4C. The second type of optical sensor may, for example, be a UV sensor, and the second optical filter 1605 may be a UV filter, such as the exemplary aluminum-dielectric UVA, UVB, or 220-nm-centered filter of FIG. 12. Alternatively, the second type of optical sensor may be a proximity sensor, and the second optical filter 1605 may be a near-IR filter, such as an all-dielectric, silicon-dielectric, or hydrogenated-silicon-dielectric near-IR filter. The plurality of first sensor elements 1611 and the second sensor element 1612 may form a photodiode array.

Of course, numerous other embodiments may be envisaged without departing from the spirit and scope of the invention.

We claim:

1. A method comprising:
   forming a photoresist layer on a surface of a substrate;
   forming, in the photoresist layer and using a development time of 80 seconds to 100 seconds, an overhang by patterning the photoresist layer in a manner that uncovers a region,
      wherein a length of the overhang, in a direction parallel to the surface of the substrate, is greater than 4 um; and
   lifting the photoresist layer in a manner that provides a clean lift-off of the photoresist layer without breaking a coating that covers the overhang.

2. The method of claim 1, wherein the length of the overhang is about 6 μm.

3. The method of claim 1, wherein the photoresist layer includes a bottom release layer.

4. The method of claim 3, wherein a thickness of the bottom release layer is greater than 2 μm.

5. The method of claim 3, wherein a thickness of the coating is about 30% of a thickness of the bottom release layer.

6. The method of claim 3, wherein a thickness of the bottom release layer is about 2.6 μm.

7. The method of claim 1, wherein the photoresist layer includes a top photosensitive layer.

8. The method of claim 7, wherein a thickness of the top photosensitive layer is about 2 μm.

9. The method of claim 1, wherein a thickness of the coating is about 500 nm.

10. The method of claim 1, wherein one or more sides of an optical filter under the overhang are sloped at an angle of about 5 degrees.

11. The method of claim 1, further comprises:
    forming an optical filter on the surface of the substrate after forming the overhang.

12. A method comprising:
    forming a photoresist layer on a surface of a substrate;
    forming, in the photoresist layer, an overhang with a length of about 6 μm in a direction parallel to the surface of the substrate; and
    lifting the photoresist layer in a manner that provides a clean lift-off of the photoresist layer without breaking a coating that covers the overhang.

13. The method of claim 12, wherein the overhang is formed using a development time of 80 seconds to 100 seconds.

14. The method of claim 12,
    wherein the photoresist layer includes a bottom release layer,
    wherein a thickness of the bottom release layer is greater than 2 μm, and
    wherein the overhang is greater than 4 μm.

15. The method of claim 12,
    wherein the photoresist layer includes a bottom release layer, and
    wherein a thickness of the coating is about 30% of a thickness of the bottom release layer.

16. The method of claim 12,
    wherein the photoresist layer includes a bottom release layer and a top photosensitive layer,
    wherein a thickness of the bottom release layer is about 2.6 μm,
    wherein a thickness of the top photosensitive layer is about 2 μm, and
    wherein a thickness of the coating is about 500 nm.

17. An optical filter, comprising:
a substrate;
an overhang over a surface of the substrate with a length of about 6 μm in a direction parallel to the surface of the substrate; and
a coating that covers the overhang,
a thickness of the coating being configured to ensure a clean lift-off of a photoresist layer without breaking the coating.

18. The optical filter of claim 17, further comprising:
one or more metal layers; and
a top dielectric layer that extends over and protectively covers one or more portions of the one or more metal layers.

19. The optical filter of claim 18, wherein the one or more portions of the one or more metal layers are tapered edges of the one or more metal layers.

20. The optical filter of claim 17, wherein one or more sides of the optical filter under the overhang are sloped at an angle of about 5 degrees.

* * * * *